(12) United States Patent
Terashima

(10) Patent No.: US 8,878,239 B2
(45) Date of Patent: Nov. 4, 2014

(54) SEMICONDUCTOR DEVICE

(71) Applicant: Mitsubishi Electric Corporation, Chiyoda-ku (JP)

(72) Inventor: Tomohide Terashima, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 13/886,399

(22) Filed: May 3, 2013

(65) Prior Publication Data
US 2014/0015004 A1 Jan. 16, 2014

Related U.S. Application Data

(62) Division of application No. 13/090,504, filed on Apr. 20, 2011, now Pat. No. 8,466,515.

(30) Foreign Application Priority Data

Aug. 30, 2010 (JP) .................................. 2010-191998

(51) Int. Cl.
| | | |
|---|---|---|
| *H01L 29/739* | (2006.01) | |
| *H01L 29/08* | (2006.01) | |
| *H01L 29/06* | (2006.01) | |
| *H01L 29/78* | (2006.01) | |
| *H01L 29/40* | (2006.01) | |
| *H01L 29/10* | (2006.01) | |

(52) U.S. Cl.
CPC ........ *H01L 29/7393* (2013.01); *H01L 29/0834* (2013.01); *H01L 29/0692* (2013.01);
(Continued)

(58) Field of Classification Search
CPC .......................... H01L 29/739; H01L 29/7393

USPC ......... 257/139, 335, 348, 506, 501, 500, 492, 257/350, 487
See application file for complete search history.

(56) References Cited

U.S. PATENT DOCUMENTS

| | | |
|---|---|---|
| 5,485,030 A | 1/1996 | Terashima |
| 5,561,077 A | 10/1996 | Terashima |

(Continued)

FOREIGN PATENT DOCUMENTS

| | | |
|---|---|---|
| CN | 1630100 A | 6/2005 |
| CN | 101034709 A | 9/2007 |

(Continued)

OTHER PUBLICATIONS

Combined Chinese Office Action and Search Report issued Sep. 16, 2013 in Patent Application No. 201110212741.2 with Cover Page and English Translation of Category of Cited Documents.

(Continued)

*Primary Examiner* — Chuong A Luu
(74) *Attorney, Agent, or Firm* — Oblon, Spivak, McClelland, Maier & Neustadt, L.L.P.

(57) ABSTRACT

On a main surface of a semiconductor substrate, an N⁻ semiconductor layer is formed with a dielectric portion including relatively thin and thick portions interposed therebetween. In a predetermined region of the N⁻ semiconductor layer, an N-type impurity region and a P-type impurity region are formed. A gate electrode is formed on a surface of a portion of the P-type impurity region located between the N-type impurity region and the N⁻ semiconductor layer. In a predetermined region of the N⁻ semiconductor layer located at a distance from the P-type impurity region, another P-type impurity region is formed. As a depletion layer block portion, another N-type impurity region higher in impurity concentration than the N⁻ semiconductor layer is formed from the surface of the N⁻ semiconductor layer to the dielectric portion.

5 Claims, 50 Drawing Sheets

(52) U.S. Cl.
CPC ........ *H01L 29/7835* (2013.01); *H01L 29/0657* (2013.01); *H01L 29/402* (2013.01); *H01L 29/1087* (2013.01); *H01L 29/407* (2013.01); *H01L 29/7394* (2013.01); *H01L 29/0696* (2013.01)
USPC ........... 257/139; 257/335; 257/500; 257/501; 257/506; 257/348

(56) References Cited

U.S. PATENT DOCUMENTS

| | | | |
|---|---|---|---|
| 6,255,690 B1* | 7/2001 | Komori et al. | 257/315 |
| 7,166,508 B2* | 1/2007 | Katayama et al. | 438/257 |
| 2004/0212019 A1* | 10/2004 | Shinohara et al. | 257/368 |
| 2005/0133814 A1 | 6/2005 | Yoshida et al. | |
| 2005/0253170 A1 | 11/2005 | Akiyama | |
| 2006/0249807 A1 | 11/2006 | Akiyama | |
| 2007/0210408 A1 | 9/2007 | Watanabe et al. | |
| 2009/0127637 A1 | 5/2009 | Akiyama | |
| 2009/0140377 A1 | 6/2009 | Akiyama | |
| 2010/0148823 A1 | 6/2010 | Shimizu | |
| 2010/0219785 A1 | 9/2010 | Hirose et al. | |
| 2011/0053348 A1 | 3/2011 | Akiyama | |
| 2011/0220999 A1* | 9/2011 | Hoshino et al. | 257/341 |
| 2012/0289013 A1* | 11/2012 | Inagawa et al. | 438/270 |

FOREIGN PATENT DOCUMENTS

| | | |
|---|---|---|
| CN | 101388409 A | 3/2009 |
| CN | 101436599 A | 5/2009 |
| CN | 101689546 A | 3/2010 |
| CN | 101752366 A | 6/2010 |
| DE | 10 2005 018 378 A1 | 11/2005 |
| DE | 10 2008 038 834 A1 | 5/2009 |
| EP | 2 105 962 A2 | 9/2009 |
| JP | 4-259259 | 9/1992 |
| JP | 6-188438 | 7/1994 |
| JP | 2001-25235 | 1/2001 |
| JP | 3588882 B2 | 11/2004 |
| KR | 10-2006-0116149 | 11/2006 |

OTHER PUBLICATIONS

Japanese Office Action issued Mar. 4, 2014, in Japan Patent Application No. 2010-191998 (with English translation).

Notice of Allowance issued Sep. 19, 2012 in Korean Patent Application No. 10-2011-0070194 (with English translation).

Office Action (with English translation) mailed on Feb. 7, 2013, in counterpart German Appnl No. 10 2011 079.307.0 (14 pages).

* cited by examiner ic field concentration on a portion of the N⁻ semiconductor layer that is located directly below the collector (electrode). In the case of the above-described IGBT, the breakdown voltage is determined by the punch-through phenomenon in which an end of the depletion layer contacts the second P-type impurity region, or determined by a leakage current of a parasitic PNP transistor formed of the second P-type impurity region, the N⁻ semiconductor layer, and the first P-type impurity region.

SEMICONDUCTOR DEVICE

CROSS-REFERENCE TO RELATED APPLICATIONS

This application is a divisional application of U.S. application Ser. No. 13/090,504 filed on Apr. 20, 2011 now U.S. Pat. No. 8,466,515, which claims priority to Japanese Patent Application No. 2010-191998 filed in the Japanese Patent Office on Aug. 30, 2010, the contents of each of which are incorporated herein by reference.

BACKGROUND OF THE INVENTION

1. Field of the Invention

The present invention relates to a semiconductor device, and particularly to a semiconductor device applied chiefly to an inverter circuit or the like.

2. Description of the Background Art

An inverter circuit that converts a DC (direct current) voltage into an AC (alternating current) voltage is used for operating a load such as induction motor. To the inverter circuit, an insulated gate bipolar transistor (IGBT) is applied as a switching device.

For a semiconductor device of this type, an SOI (Silicon On Insulator) substrate is used. In the SOI substrate, an N⁻ semiconductor layer is formed on a main surface of a semiconductor substrate with an insulating film interposed between the main surface and the N⁻ semiconductor layer. In the N⁻ semiconductor layer, a first N-type impurity region is formed to a predetermined depth from the surface of the N⁻ semiconductor layer. A first P-type impurity region is formed to surround the first N-type impurity region laterally and from below. On a surface of a portion of the first P-type impurity region that is located between the first N-type impurity region and the N⁻ semiconductor layer, a gate electrode is formed with a gate insulating film interposed between the surface and the gate electrode. Further, an emitter electrode is formed to contact respective surfaces of the first P-type impurity region and the first N-type impurity region.

In a predetermined region of the N⁻ semiconductor layer located at a distance from the first P-type impurity region, a second P-type impurity region is formed from the surface of the N⁻ semiconductor layer to a predetermined depth. A collector electrode is formed to contact the surface of the second P-type impurity region. In another predetermined region of the N⁻ semiconductor layer located at a predetermined distance on a side where the first P-type impurity region is located, with respect to the second P-type impurity region, a second N-type impurity region is formed from the surface of the N⁻ semiconductor layer to a predetermined depth to serve as a stopper against a depletion layer. The emitter electrode, the collector electrode, and the gate electrode constitute corresponding electrodes of the IGBT, respectively.

While the semiconductor device is in an OFF state, a depletion layer expands mainly toward the N⁻ semiconductor layer, from the interface between the first P-type impurity region and the N⁻ semiconductor layer. At this time, the impurity concentration and the thickness of the N⁻ semiconductor layer can be adjusted to convert the whole of the N⁻ semiconductor layer into a depletion layer. Under the condition that the electric field is substantially uniform in the surface region of the N⁻ semiconductor layer, a maximum breakdown voltage is obtained.

Under this condition, if the distance (space) between the emitter (electrode) and the collector (electrode) is increased, finally the breakdown voltage of the whole is restricted due to Conventionally, with the purpose of increasing the breakdown voltage of a semiconductor device, a technique of providing the second N-type impurity region to serve as a stopper against the depletion layer as described above has generally been employed. A technique of extending the collector electrode toward the emitter side has also been employed.

The inventor of the present invention has proposed in Japanese Patent Laying-Open No. 06-188438 a semiconductor device including a dielectric portion with a predetermined thickness provided between a semiconductor substrate and an N⁻ semiconductor layer. In this semiconductor device, the thickness of a part of the dielectric portion located directly below a collector electrode is made larger than the thickness of the remaining part of the dielectric portion. In the structure of the semiconductor substrate, the dielectric portion, and the N⁻ semiconductor layer (laminate structure), the electric field intensity of the semiconductor substrate, the dielectric portion, and the N⁻ semiconductor layer each is an inverse of the ratio between respective dielectric constants of them. Thus, a dielectric portion of a larger thickness can be provided to further increase a voltage drop in the dielectric portion, and accordingly decrease a voltage drop in a portion of the N⁻ semiconductor layer which is located directly below the collector (electrode) and into which the depletion layer is to expand. Consequently, the margin of the breakdown voltage of the whole semiconductor device is increased and the breakdown voltage characteristic of the semiconductor device can be improved.

As seen from the above, for the conventional semiconductor devices, various proposals have been advanced in order to improve the breakdown voltage characteristic. Improvement of the breakdown voltage has been demanded for the semiconductor devices, not only for the IGBT but also for a p-channel MOS (Metal Oxide Semiconductor) transistor (PMOS) applied as a device for generating a signal to cause the IGBT to perform a switching operation.

SUMMARY OF THE INVENTION

The semiconductor device of the present invention has been devised in the course of the above-described development, and an object of the invention is to provide a semiconductor device with a further improved breakdown voltage characteristic.

A semiconductor device according to the present invention includes a semiconductor substrate having a main surface, a dielectric portion, a semiconductor region of a first conductivity type having a first impurity concentration, a first impurity region of the first conductivity type, a second impurity region of a second conductivity type, a gate electrode portion, a third impurity region of the second conductivity type having a second impurity concentration, and a depletion layer block portion including a conductive region. The dielectric portion is formed to contact the main surface of the semiconductor substrate and having a first thickness and a second thickness larger than the first thickness. The semiconductor region of the first conductivity type having the first impurity concentration is formed to contact the dielectric portion. The first impurity region of the first conductivity type is formed from a surface of the semiconductor region to a first depth in a first region of the semiconductor region, the first region being located directly above a portion which is a part of the dielectric portion and has the first thickness. The second impurity region of the second conductivity type is formed from the surface of the semiconductor region to a second depth larger than the first depth in the first region to surround the first impurity region laterally and from below. The gate electrode portion is formed on a surface of a portion of the second impurity region located between the first impurity region and the semiconductor region, with a gate insulating film interposed between the gate electrode portion and the surface of the portion of the second impurity region. The third impurity region of the second conductivity type having the second impurity concentration is formed from the surface of the semiconductor region to a third depth in a second region of the semiconductor region, the second region being located at a distance from the second impurity region and directly above a portion which is a part of the dielectric portion and has the second thickness. The depletion layer block portion including a conductive region is formed at a predetermined position in the second region to extend from the surface of the semiconductor region and reach the dielectric portion.

Another semiconductor device according to the present invention includes a semiconductor substrate having a main surface, a dielectric portion, a semiconductor region of a first conductivity type having a first impurity concentration, a first impurity region of a second conductivity type having a second impurity concentration, a second impurity region of the second conductivity type having a third impurity concentration, a third impurity region of the second conductivity type, a gate electrode, and a depletion layer block portion including a conductive region. The dielectric portion is formed to contact the main surface of the semiconductor substrate and having a first thickness and a second thickness larger than the first thickness. The semiconductor region of the first conductivity type having the first impurity concentration is formed to contact the dielectric portion. The first impurity region of the second conductivity type having the second impurity concentration is formed from a surface of the semiconductor region to a first depth in a first region of the semiconductor region, the first region being located directly above a portion which is a part of the dielectric portion and has the first thickness. The second impurity region of the second conductivity type having the third impurity concentration is formed from the surface of the semiconductor region to a predetermined depth, and extending from the first impurity region toward a second region of the semiconductor region, the second region being located directly above a portion which is a part of the dielectric portion and has the second thickness. The third impurity region of the second conductivity type is located at a distance from the second impurity region and formed in the second region from the surface of the semiconductor region to a predetermined depth. The gate electrode portion is formed on a surface of a portion of the semiconductor region located between the second impurity region and the third impurity region with a gate insulating film interposed between the gate electrode portion and the surface of the portion of the semiconductor region. The depletion layer block portion including a conductive region is formed at a predetermined position in the second region to extend from the surface of the semiconductor region and reach the dielectric portion.

In the semiconductor device of the present invention, a depletion layer block portion including an electrically conductive region is formed at a predetermined position in the second region to extend from the surface of the semiconductor region to the dielectric portion. Accordingly, in an OFF state, a depletion layer which expands from the interface between the second impurity region and the semiconductor region toward the semiconductor region can surely be blocked from expanding further to the third impurity region, without lowering of the breakdown voltage. In this way, the margin of the breakdown voltage is increased and the breakdown voltage characteristic of the semiconductor device can further be improved.

In the other semiconductor device of the present invention, a depletion layer block portion including an electrically conductive region is formed at a predetermined position in the second region to extend from the surface of the semiconductor region to the dielectric portion. Accordingly, in an OFF state, a depletion layer which expands from the interface between the first impurity region and the semiconductor region toward the semiconductor region can surely be blocked from expanding further to the third impurity region, without lowering of the breakdown voltage. In this way, the margin of the breakdown voltage is increased and the breakdown voltage characteristic of the semiconductor device can further be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
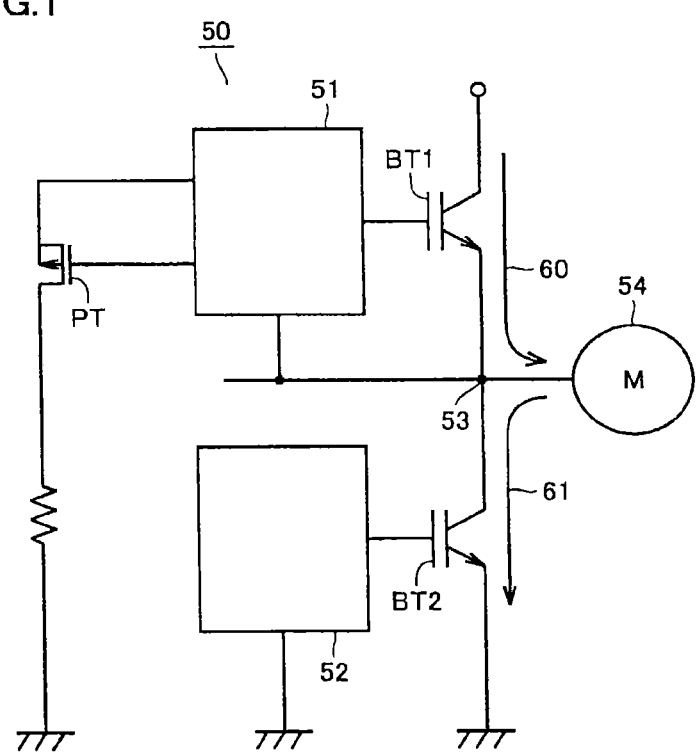
FIG. 1 is a diagram showing an inverter circuit to which a semiconductor device according to each embodiment of the present invention is applied.

First, a brief description will be given of an inverter circuit for driving an induction motor 54, as an example of circuits to which the present semiconductor device may be applied. As shown in FIG. 1, for a first driver circuit 51 of inverter circuit 50, a first IGBT (BT1) is provided as a switching device for performing an operation of feeding electric current to induction motor 54 (Operation A). For a second driver circuit 52, a second IGBT (BT2) is provided as a switching device for performing an operation of drawing electric current from induction motor 54 (Operation B).

The first IGBT (BT1) and the second IGBT (BT2) are connected in series, and induction motor 54 is connected to their connection point 53. The first IGBT (BT1) has its gate connected to first driver circuit 51, and the second IGBT (BT2) has its gate connected to second driver circuit 52. First driver circuit 51 and second driver circuit 52 are used to alternately turn on or off the first IGBT (BT1) and the second IGBT (BT2) to thereby perform Operation A and Operation B in turns.

At this time, at connection point 53, the potential varies between a power supply voltage and a ground potential. Accordingly, in order to generate a constant pulse potential (signal) to cause the gate of the first IGBT (BT1) to be turned on or off in response to the variation of the potential, first driver circuit 51 is provided with a circuit including a p-channel type MOS transistor (PMOS) PT. In this circuit, a characteristic that the drain current has substantially the same value in response to variation of the drain voltage of the MOS transistor (saturation region) is used to generate a constant pulse potential.

In connection with the following embodiments, an IGBT and a p-channel MOS transistor applied to the above-described inverter circuit will specifically be described.

First Embodiment

Figure 2:
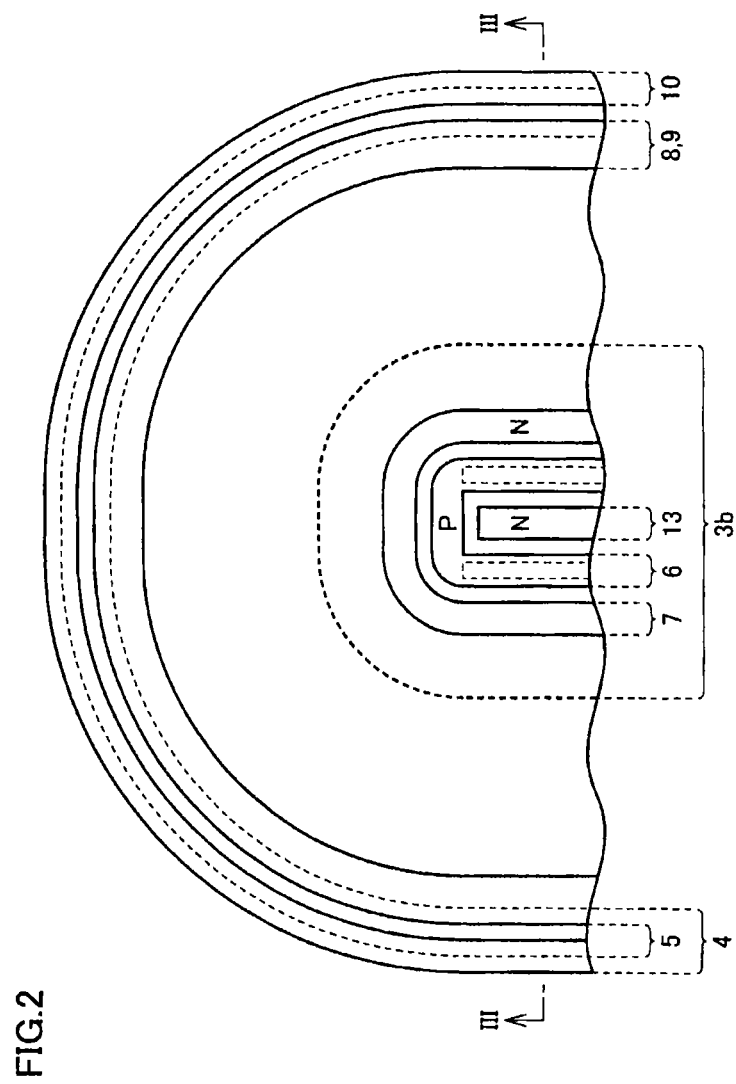
FIG. 2 is a partial plan view showing a semiconductor device according to a first embodiment of the present invention.
Figure 3:
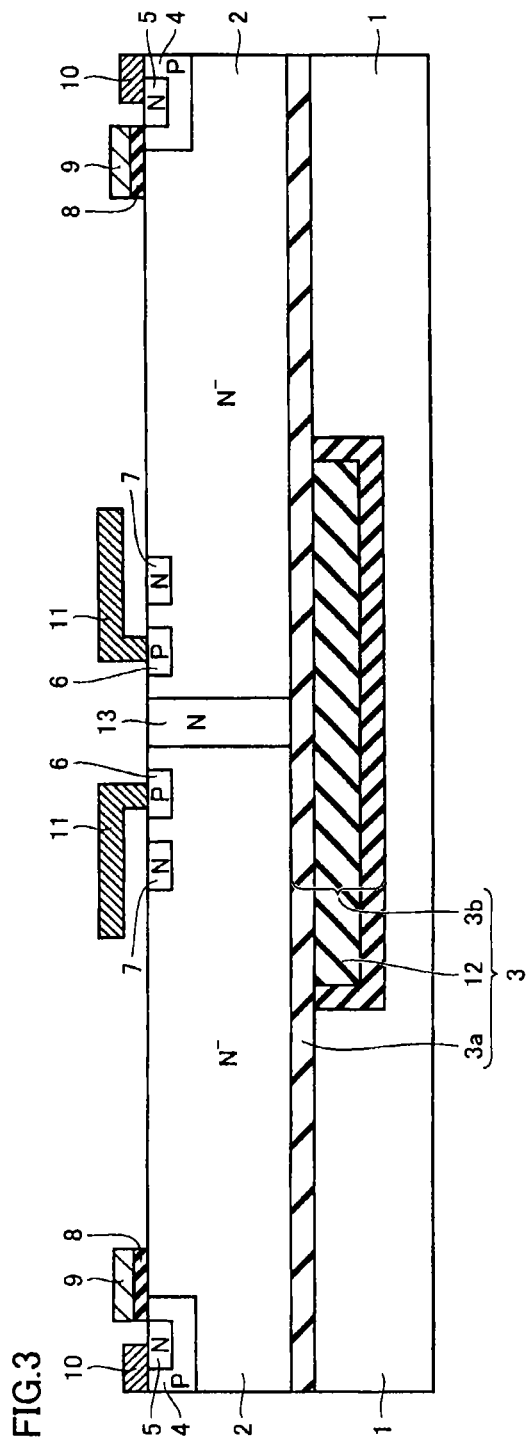
FIG. 3 is a cross section along a line III-III shown in FIG. 2 in the first embodiment.

Here, a first example of the IGBT will be described. As shown in FIGS. 2 and 3, a dielectric portion 3 is formed to contact a main surface of a semiconductor substrate 1. Dielectric portion 3 includes a relatively thin portion 3a and a relatively thick portion 3b. In relatively thick portion 3b, a dielectric film 12 is formed. An N⁻ semiconductor layer 2 of a predetermined thickness is formed to contact a surface of dielectric portion 3. N⁻ semiconductor layer 2 has an impurity concentration of approximately $5 \times 10^{14}/cm^3$ to $5 \times 10^{15}/cm^3$, for example. In a region (Region A) of N⁻ semiconductor layer 2 that is located directly above relatively thin portion 3a of dielectric portion 3, an N-type impurity region 5 is formed from a surface of N⁻ semiconductor layer 2 to a predetermined depth. A P-type impurity region 4 is formed from the surface of N⁻ semiconductor layer 2 to extend in a region deeper than N-type impurity region 5 and surround N-type impurity region 5 laterally and from below. On a surface of a portion of P-type impurity region 4 that is located between N-type impurity region 5 and N⁻ semiconductor layer 2, a gate electrode 9 is formed with a gate insulating film 8 interposed between the gate electrode and the surface. Further, an emitter electrode 10 is formed to contact P-type impurity region 4 and N-type impurity region 5.

In a region (Region B) of N⁻ semiconductor layer 2 that is located at a distance from P-type impurity region 4 and directly above relatively thick portion 3b of dielectric portion 3, a P-type impurity region 6 is formed from the surface of N⁻ semiconductor layer 2 to a predetermined depth. A collector electrode 11 is formed to contact P-type impurity region 6. Further, in a portion of N⁻ semiconductor layer 2 that is located between P-type impurity region 4 and P-type impurity region 6, an N-type impurity region 7 is formed from the surface of N⁻ semiconductor layer 2 to a predetermined depth to serve as a stopper against a depletion layer. Furthermore, in Region B, an N-type impurity region 13 having a higher impurity concentration than that of N⁻ semiconductor layer 2 is formed as a depletion layer block portion to extend from the surface of N⁻ semiconductor layer 2 and reach dielectric portion 3. N-type impurity region 13 has an impurity concentration of approximately $1 \times 10^{16}/cm^3$ to $1 \times 10^{19}/cm^3$, for example. In the case where impurity ions are introduced from the surface of N⁻ semiconductor layer 2 to form N-type impurity region 13, the above-indicated impurity concentration is the impurity concentration near the surface of N⁻ semiconductor layer 2.

As shown in FIG. 2, N-type impurity region 13 is formed to extend along one direction. P-type impurity region 6 and N-type impurity region 7 are arranged to circumferentially surround N-type impurity region 13. Further, P-type impurity region 4, N-type impurity region 5, gate electrode 9, and emitter electrode 10 are arranged to circumferentially surround the region including N-type impurity region 7.

Figure 4:
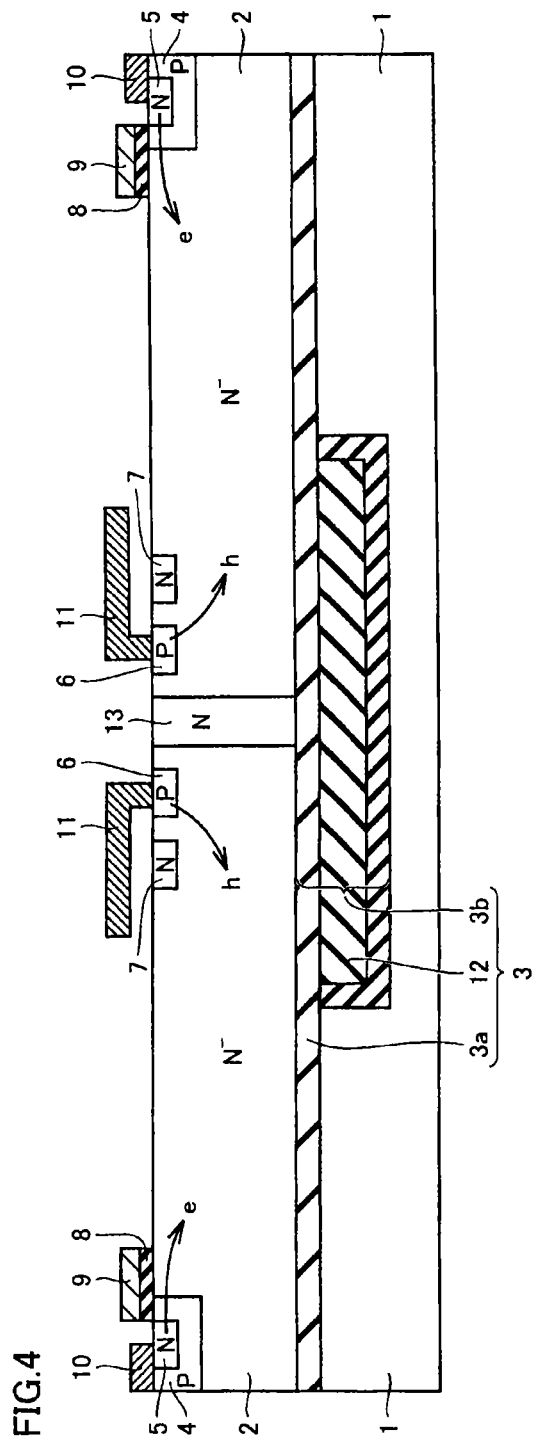
FIG. 4 is a cross section for illustrating an ON operation of the semiconductor device in the first embodiment.

Next, an operation of the above-described semiconductor device (IGBT) will be described. As shown in FIG. 4, a higher voltage than a predetermined threshold voltage is first applied to gate electrode 9 to cause a channel to be formed in a portion of P-type impurity region 4 that is located directly below gate electrode 9. With the channel thus formed, electrons e are injected from emitter electrode 10 to N⁻ semiconductor layer 2 through N-type impurity region 5 and the channel, while holes h are injected from collector electrode 11 to N⁻ semiconductor layer 2 through P-type impurity region 6. Accordingly, the resistance value of N⁻ semiconductor layer 2 decreases due to conductivity modulation to cause a state in which electric current flows from the collector side toward the emitter side (ON state).

In contrast, when a lower voltage than the threshold voltage is applied to gate electrode 9, the channel formed in P-type impurity region 4 disappears. As the channel has disappeared, injection of electrons to N⁻ semiconductor layer 2 stops and the electrons and holes having been accumulated in N⁻ semiconductor layer 2 recombine to thereby disappear, or discharged to emitter electrode 10 or collector electrode 11 to thereby disappear, resulting in a state in which the current is interrupted (OFF state). At this time, while the potential of emitter electrode 10 is substantially a ground potential, a voltage of approximately 500 to 600 V for example is applied to collector electrode 11.

Figure 5:
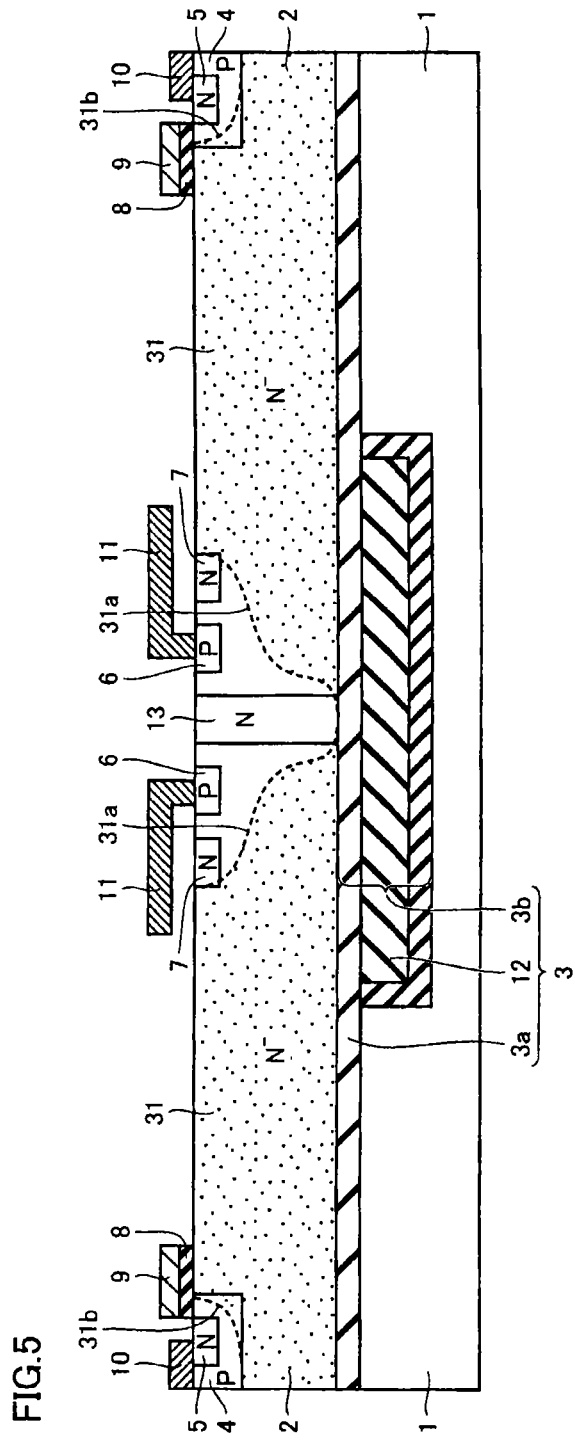
FIG. 5 is a cross section for illustrating how a depletion layer expands while the semiconductor device is in an OFF state in the first embodiment.

Consequently, as shown in FIG. 5, a reverse bias is applied and a depletion layer 31 expands from the interface between P-type impurity region 4 and N⁻ semiconductor layer 2. Here, the end of depletion layer 31 expanding toward N⁻ semiconductor layer 2 is indicated as a depletion-layer end 31a, and the end of depletion layer 31 expanding toward P-type impurity region 4 is indicated as a depletion-layer end 31b. As shown in FIG. 5, depletion layer 31 chiefly expands toward N⁻ semiconductor layer 2 of a relatively low impurity concentration, and depletion-layer end 31a extends to reach near the region where N-type impurity region 7 serving as a stopper against the depletion layer is located. In particular, in the above-described semiconductor device, N-type impurity region 13 extending from the surface of N⁻ semiconductor layer 2 to reach dielectric portion 3 is formed to ensure that depletion layer 31 is prevented from expanding to P-type impurity region 6 and enable improvement of the breakdown voltage characteristic. This will further be described with reference to a comparative example.

Figure 6:
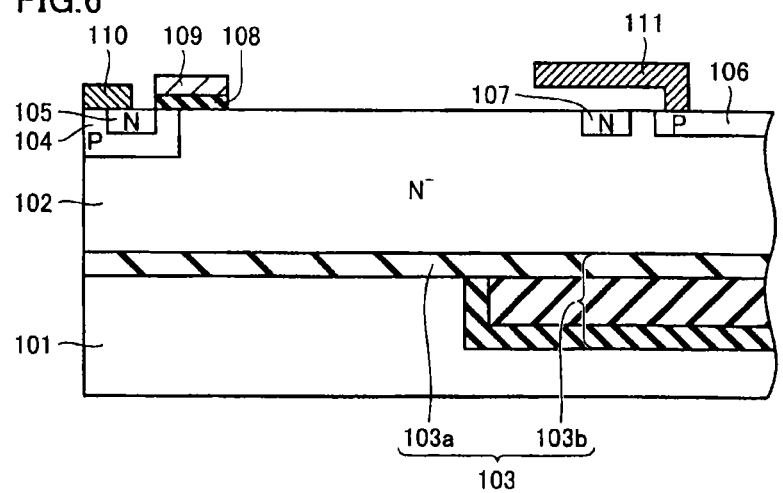
FIG. 6 is a partial cross section showing a semiconductor device according to a comparative example.

A semiconductor device of the comparative example is configured similarly to the semiconductor device shown exemplarily in FIG. 3, except that N-type impurity region 13 extending from the surface of N⁻ semiconductor layer 2 to reach dielectric portion 3 is not formed. As shown in FIG. 6, a dielectric portion 103 including a relatively thin portion 103a and a relatively thick portion 103b is formed to contact a main surface of a semiconductor substrate 101. An N⁻ semiconductor layer 102 of a predetermined thickness is formed to contact a surface of dielectric portion 103. In a predetermined region of N⁻ semiconductor layer 102, an N-type impurity region 105 is formed from a surface of N⁻ semiconductor layer 102 to a predetermined depth.

A P-type impurity region 104 is formed from the surface of N⁻ semiconductor layer 102 to extend in a region deeper than N-type impurity region 105 and surround N-type impurity region 105 laterally and from below. On a surface of a portion of P-type impurity region 104 located between N-type impurity region 105 and N⁻ semiconductor layer 102, a gate electrode 109 is formed with a gate insulating film 108 interposed therebetween. An emitter electrode 110 is formed to contact P-type impurity region 104 and N-type impurity region 105.

In a predetermined region of N⁻ semiconductor layer 102 located at a distance from P-type impurity region 104, a P-type impurity region 106 is formed from the surface of N⁻ semiconductor layer 102 to a predetermined depth. A collector electrode 111 is formed to contact P-type impurity region 106. In a portion of N⁻ semiconductor layer 102 that is located between P-type impurity region 104 and P-type impurity region 106, an N-type impurity region 107 is formed from the surface to a predetermined depth to serve as a stopper against a depletion layer.

In the semiconductor device of the comparative example, a higher voltage than a predetermined threshold voltage is applied to gate electrode 109 to thereby cause electrons e and holes h to be injected to N⁻ semiconductor layer 102, cause the resistance value of N⁻ semiconductor layer 102 to decrease due to conductivity modulation and thereby cause electric current from the collector side toward emitter side (ON state).

In contrast, a lower voltage than the threshold voltage applied to gate electrode 109 causes injection of electrons to N⁻ semiconductor layer 102 to stop, electrons and holes having been accumulated in N⁻ semiconductor layer 102 to recombine and thereby disappear or to be discharged to emitter electrode 110 or collector electrode 111 to thereby disappear, resulting in a state where the current is interrupted (OFF state). In the OFF state, a reverse bias is applied and, from the interface between P-type impurity region 104 and N⁻ semiconductor layer 102, a depletion layer expands mainly to N⁻ semiconductor layer 102 of a relatively low impurity concentration.

Figure 7:
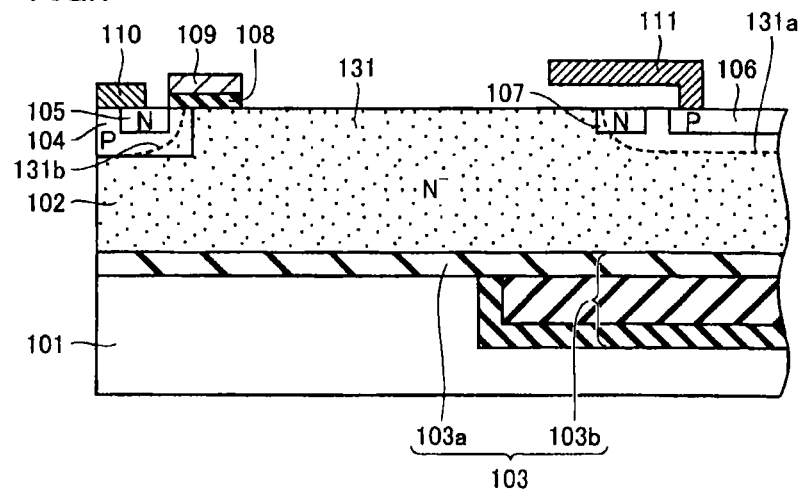
FIG. 7 is a partial cross section for illustrating how a depletion layer expands while the semiconductor device of the comparative example is in an OFF state.

At this time, as shown in FIG. 7, in the surface and its nearby region of N⁻ semiconductor layer 102, the depletion layer which is expanding toward N⁻ semiconductor layer 102 is hindered from expanding by N-type impurity region 107 serving as a stopper. In contrast, in a region of N⁻ semiconductor layer 102 that is located below P-type impurity region 106, a depletion-layer end 131a reaches near P-type impurity region 106. Therefore, the breakdown voltage of the semiconductor device of the comparative example is determined by the punch-through phenomenon in which depletion-layer end 131a contacts P-type impurity region 106, or determined by a leakage current of a parasitic PNP transistor constituted of P-type impurity region 106, N⁻ semiconductor layer 102, and P-type impurity region 104. Thus, further improvement of the breakdown voltage characteristic has its limit.

In contrast, in the above-described semiconductor device, it is an essential structure in which P-type impurity region 6 to which a high voltage is applied is formed in a region of N⁻ semiconductor layer 2 that is located directly above relatively thick portion 3b of dielectric portion 3. In the laminate structure of dielectric portion 3 and N⁻ semiconductor layer 2, the electric field intensity of the dielectric portion and N⁻ semiconductor layer each is an inverse of the ratio between respective dielectric constants of them. The dielectric constant of dielectric portion 3 (about 3.7) is lower than the dielectric constant of N⁻ semiconductor layer 2 (about 11.7), and dielectric portion 3 is formed to have a larger thickness.

Figure 8:
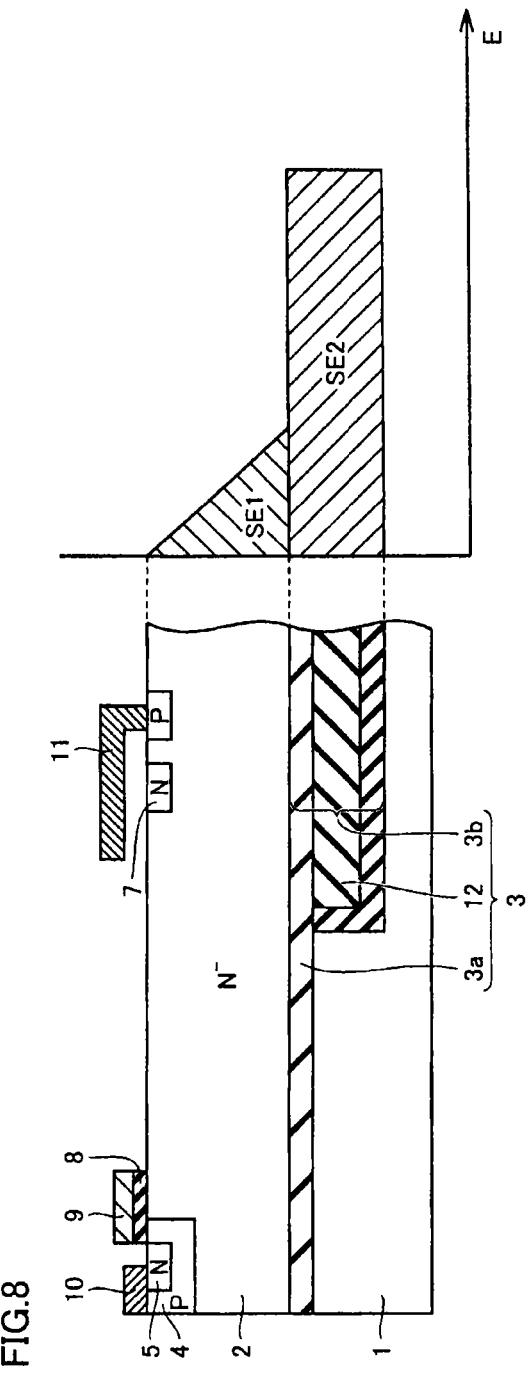
FIG. 8 is a graph showing a relation between an electric field intensity and a depth from a surface of an N$^-$ semiconductor layer for illustrating the breakdown voltage in the first embodiment.

FIG. 8 is a graph showing a relation between the electric field intensity and the depth from the surface of the N⁻ semiconductor layer. The breakdown voltage of the semiconductor device corresponds to the area of the hatched region in the graph. In the region representing the breakdown voltage, a voltage drop in N⁻ semiconductor layer 2 corresponds to an area SE1, and a voltage drop in the dielectric portion corresponds to an area SE2. In the region where collector electrode 11 is located, the dielectric portion (portion 3b) can be made relatively thicker so that the voltage drop in the dielectric portion (3b) is larger to thereby reduce the voltage drop in the portion of N⁻ semiconductor layer 2 located in this region. In this way, while expansion of the depletion layer toward P-type impurity region 6 connected to collector electrode 11 is suppressed, reduction of the breakdown voltage of the semiconductor device can still be suppressed.

As shown in FIG. 5, the above-described semiconductor device includes N-type impurity region 13 as a depletion layer block portion that suppresses expansion of the depletion layer. N-type impurity region 13 has a higher impurity concentration than the impurity concentration of N⁻ semiconductor layer 2, and is formed to extend from the surface of N⁻ semiconductor layer 2 and reach dielectric portion 3 (portion 3b). Accordingly, expansion of the depletion layer toward P-type impurity region 6 from the portion of N⁻ semiconductor layer 2 located below P-type impurity region 6 can surely be blocked without decreasing the breakdown voltage of the semiconductor device. Consequently, the breakdown voltage margin is enhanced and the breakdown voltage characteristic of the semiconductor device can further be improved.

According to the foregoing description of the semiconductor device, dielectric film 12 is formed in relatively thick portion 3b of dielectric portion 3. In relatively thick portion 3b, a hollow portion may be formed instead of dielectric film 12. The hollow portion has a dielectric constant (about 1.0) smaller than the dielectric constant of the dielectric film. Therefore, a larger voltage drop in the dielectric portion (portion 3b) is accompanied by a smaller voltage drop in the portion of N⁻ semiconductor layer 2. Consequently, the breakdown voltage margin is further enhanced and the breakdown voltage characteristic of the semiconductor device can surely be improved.

Modification

Figure 9:
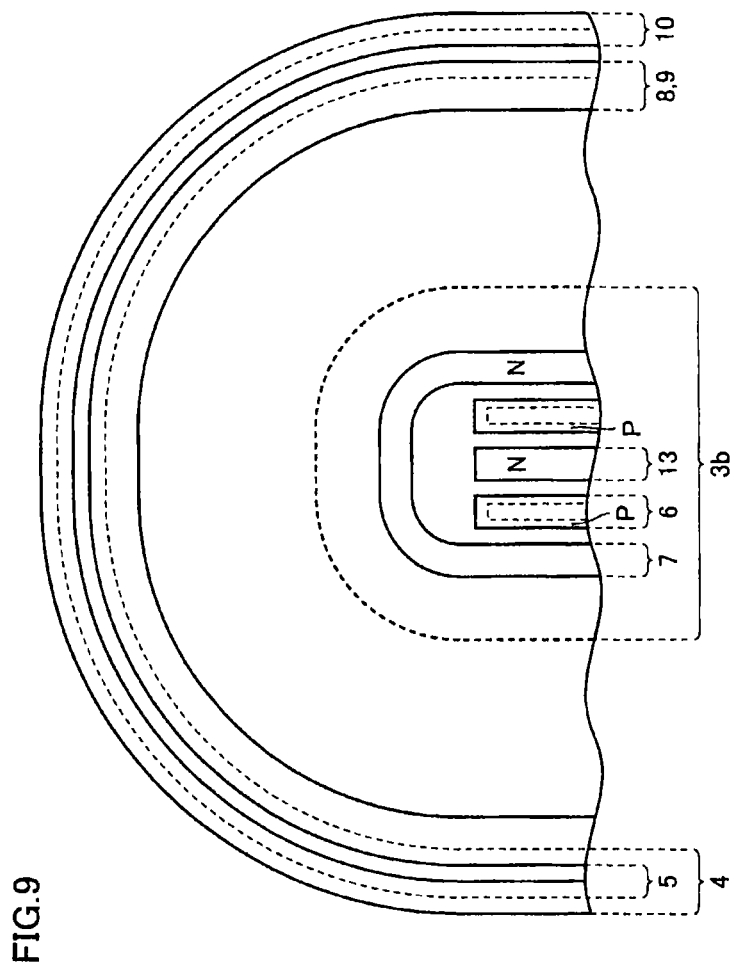
FIG. 9 is a partial plan view showing a semiconductor device according to a modification of the first embodiment.

In the foregoing description of the semiconductor device, an example of the structure as seen in a plan view as shown in FIG. 2 is described in which P-type impurity region 6 is formed to surround N-type impurity region 13. The plan view structure of P-type impurity region 6 may also be the one as shown in FIG. 9 in which P-type impurity region 6 on one side and P-type impurity region 6 on the other side with respect to extending N-type impurity region 13 are arranged to be spaced from each other in the direction crossing the direction in which N-type impurity region 13 extends. The semiconductor device having this arrangement can also surely block expansion of depletion layer 31 toward P-type impurity region 6 without decreasing the breakdown voltage. Consequently, the breakdown voltage margin is enhanced and the breakdown voltage characteristic of the semiconductor device can further be improved.

Second Embodiment

Figure 10:
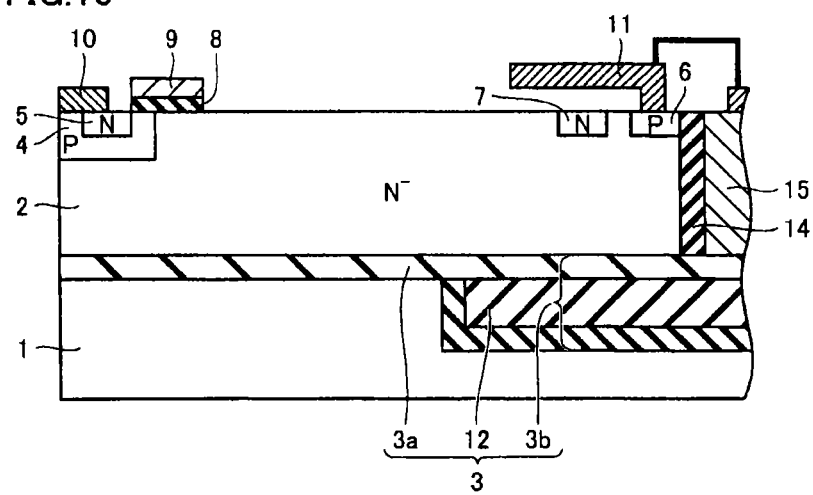
FIG. 10 is a partial cross section showing a semiconductor device according to a second embodiment of the present invention.

Here, a second example of the IGBT will be described. As shown in FIG. 10, in a region (Region B) of N⁻ semiconductor layer 2 that is located directly above relatively thick portion 3b of dielectric portion 3, an insulating film 14 and an electrically conductive portion 15 are formed as a depletion layer block portion to extend from the surface of N⁻ semiconductor layer 2 and reach dielectric portion 3. Conductive portion 15 is formed for example of a polysilicon film or the like, electrically insulated from N⁻ semiconductor layer 2 by insulating film 14, and electrically connected to collector electrode 11. Except for the above, the structure of the semiconductor device is similar to the semiconductor device shown in FIG. 3, and therefore, the same components are denoted by the same reference characters and the description thereof will not be repeated.

In the above-described semiconductor device (IGBT), a higher voltage than a predetermined threshold voltage applied to gate electrode 9 causes electrons and holes to be injected to N⁻ semiconductor layer 2, so that the resistance value of N⁻ semiconductor layer 2 decreases due to conductivity modulation to cause a state (ON state) in which electric current flows from the collector side toward the emitter side.

In contrast, a lower voltage than the threshold voltage applied to gate electrode 9 causes injection of electrons to N⁻ semiconductor layer 2 to stop, so that electrons and holes having been accumulated in N⁻ semiconductor layer 2 recombine to thereby disappear, or are discharged to emitter electrode 10 or collector electrode 11 to thereby disappear, to finally cause a state (OFF state) in which the electric current is interrupted. In the OFF state, a reverse bias is applied and, from the interface between P-type impurity region 4 and N⁻ semiconductor layer 2, a depletion layer mainly expands toward N⁻ semiconductor layer 2.

Figure 11:
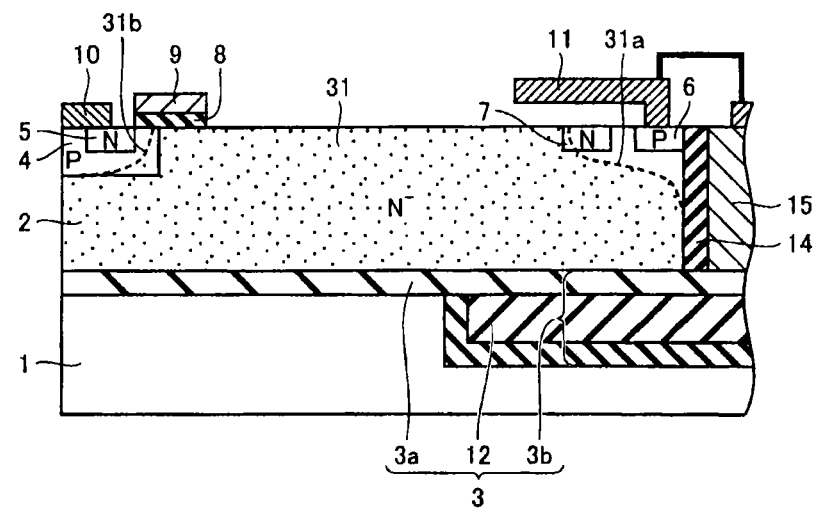
FIG. 11 is a cross section for illustrating how a depletion layer expands while the semiconductor device is in an OFF state in the second embodiment.

At this time, in Region B as shown in FIG. 11, insulating film 14 and conductive portion 15 are formed as a depletion layer block portion to extend from the surface of N⁻ semiconductor layer 2 and reach dielectric portion 3. In this way, as described above, depletion layer 31 can surely be blocked from expanding toward P-type impurity region 6, from the portion of N⁻ semiconductor layer 2 that is located below P-type impurity region 6, without lowering of the breakdown voltage of the semiconductor device. Consequently, the breakdown voltage margin is enhanced and the breakdown voltage characteristic of the semiconductor device can further be improved.

Meanwhile, the laminate structure including semiconductor substrate 1, dielectric portion 3, and N⁻ semiconductor layer 2 is provided as an SOI substrate. In the case where various devices are to be formed at N⁻ semiconductor layer 2 of the SOI substrate, the devices must be electrically isolated from each other. For this purpose, a trench isolation structure is employed. In the trench isolation structure, a trench extending through N⁻ semiconductor layer 2 to reach dielectric portion 3 is formed, and a polysilicon film or the like is formed in the trench with an insulating film therebetween.

In the above-described semiconductor device, when such a trench isolation structure for electrical isolation is formed, a trench isolation structure is simultaneously formed in the vicinity of P-type impurity region 6 so that the trench isolation structure can be used as a depletion layer block portion including insulating film 14 and conductive portion 15, without additional processes.

Third Embodiment

Figure 12:
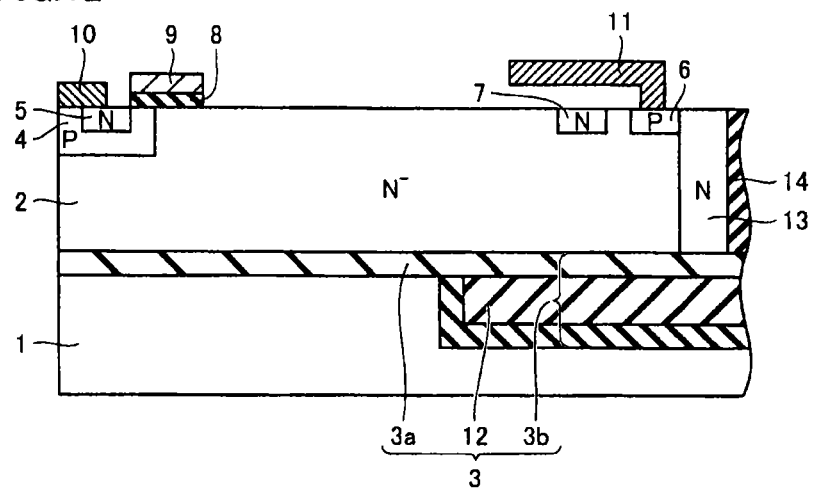
FIG. 12 is a partial cross section showing a semiconductor device according to a third embodiment of the present invention.

Here, a third example of the IGBT will be described. As shown in FIG. 12, in a region (Region B) of N⁻ semiconductor layer 2 that is located directly above relatively thick portion 3b of the dielectric portion, an N-type impurity region 13 and an insulating film 14 are formed as a depletion layer block portion to extend from the surface of N⁻ semiconductor layer 2 and reach dielectric portion 3. Except for the above, the structure of this semiconductor device is similar to the semiconductor device shown in FIG. 3, and therefore, the same components are denoted by the same reference characters and the description thereof will not be repeated.

In the above-described semiconductor device (IGBT), a higher voltage than a predetermined threshold voltage applied to gate electrode 9 causes electrons and holes to be injected to N⁻ semiconductor layer 2, so that the resistance value of N⁻ semiconductor layer 2 decreases due to conductivity modulation to cause a state (ON state) in which electric current flows from the collector side toward the emitter side.

In contrast, a lower voltage than the threshold voltage applied to gate electrode 9 causes injection of electrons to N⁻ semiconductor layer 2 to stop, so that electrons and holes having been accumulated in N⁻ semiconductor layer 2 recombine to thereby disappear, or are discharged to emitter electrode 10 or collector electrode 11 to thereby disappear, to finally cause a state (OFF state) in which the electric current is interrupted. In the OFF state, a reverse bias is applied and, from the interface between P-type impurity region 4 and N⁻ semiconductor layer 2, a depletion layer mainly expands toward N⁻ semiconductor layer 2.

Figure 13:
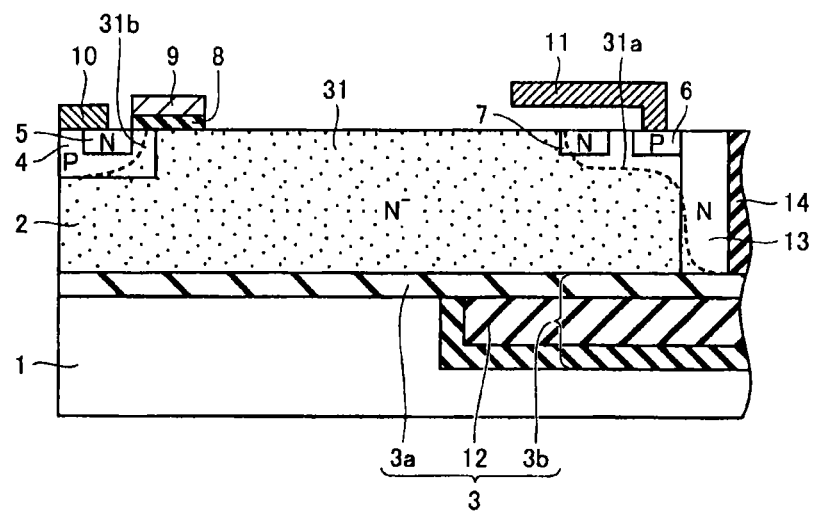
FIG. 13 is a cross section for illustrating how a depletion layer expands while the semiconductor device is in an OFF state in the third embodiment.

At this time, in Region B as shown in FIG. 13, N-type impurity region 13 and insulating film 14 are formed as a depletion layer block portion to extend from the surface of N⁻ semiconductor layer 2 and reach dielectric portion 3. In this way, as described above, depletion layer 31 can surely be blocked from expanding toward P-type impurity region 6, from the portion of N⁻ semiconductor layer 2 that is located below P-type impurity region 6, without lowering of the breakdown voltage of the semiconductor device. Consequently, the breakdown voltage margin is enhanced and the breakdown voltage characteristic of the semiconductor device can further be improved.

Further, as described above, a trench is formed for electrically isolating devices formed at N⁻ semiconductor layer 2. In the above-described semiconductor device, simultaneously with formation of such a trench in N⁻ semiconductor layer 2, a trench is also formed near P-type impurity region 6 and N-type impurity ions are injected to the sidewall of the trench so that N-type impurity region 13 can be formed. In this way, as compared with the case where the N-type impurity region is formed by diffusing N-type impurity from the surface of N⁻ semiconductor layer 2, lateral diffusion of the N-type impurity can be suppressed, which can contribute to further reduction of the device area.

Fourth Embodiment

Figure 14:
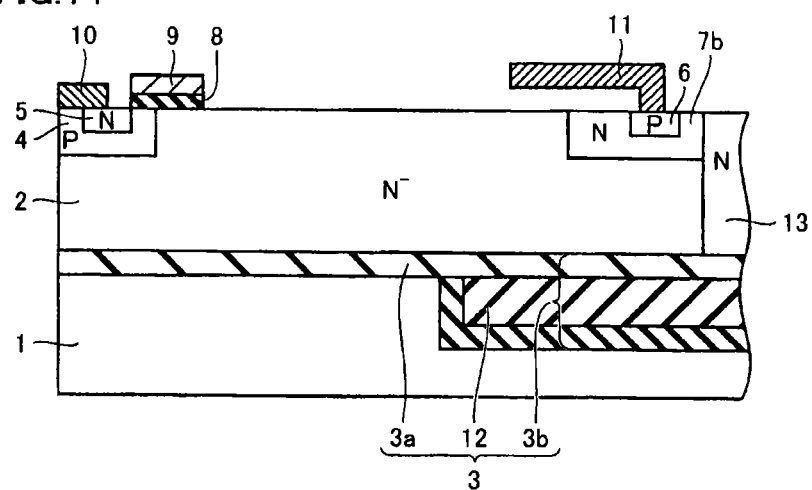
FIG. 14 is a partial cross section showing a semiconductor device according to a fourth embodiment of the present invention.

Here, a fourth example of the IGBT will be described. This semiconductor device corresponds to the semiconductor device shown in FIG. 3 in which N-type impurity region 7 is replaced with an N-type impurity region surrounding P-type impurity region 6. As shown in FIG. 14, this N-type impurity region 7b is formed to surround P-type impurity region 6 laterally and from below. Except for the above, the structure of this semiconductor device is similar to the semiconductor device shown in FIG. 3, and therefore, the same components are denoted by the same reference characters and the description thereof will not be repeated.

In the above-described semiconductor device (IGBT), a higher voltage than a predetermined threshold voltage applied to gate electrode 9 causes electrons and holes to be injected to N⁻ semiconductor layer 2, so that the resistance value of N⁻ semiconductor layer 2 decreases due to conductivity modulation to cause a state (ON state) in which electric current flows from the collector side toward the emitter side.

Figure 15:
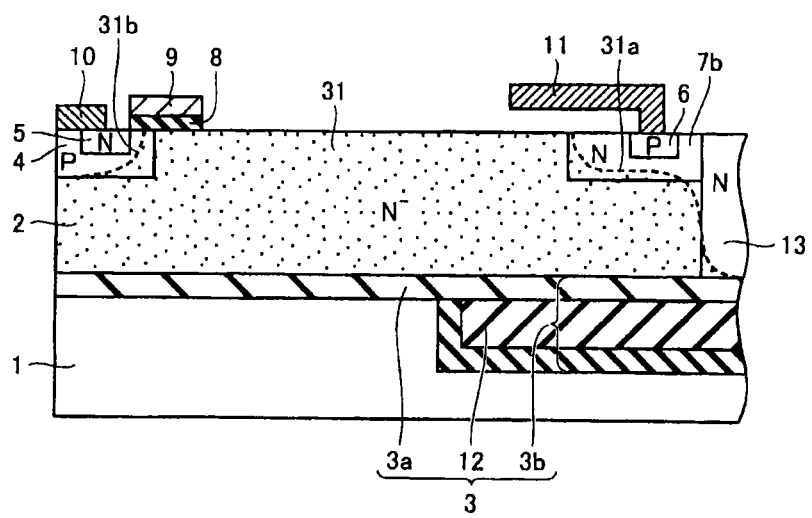
FIG. 15 is a cross section for illustrating how a depletion layer expands while the semiconductor device is in an OFF state in the fourth embodiment.

In contrast, a lower voltage than the threshold voltage applied to gate electrode 9 causes injection of electrons to N⁻ semiconductor layer 2 to stop, so that electrons and holes having been accumulated in N⁻ semiconductor layer 2 recombine to thereby disappear, or are discharged to emitter electrode 10 or collector electrode 11 to thereby disappear, to finally cause a state (OFF state) in which the electric current is interrupted. In the OFF state, as shown in FIG. 15, a reverse bias is applied and, from the interface between P-type impurity region 4 and N⁻ semiconductor layer 2, a depletion layer mainly expands toward N⁻ semiconductor layer 2.

In the case of the above-described semiconductor device (IGBT), because N-type impurity region 7b is formed to surround P-type impurity region 6, the efficiency of injection of holes to N⁻ semiconductor layer 2 is somewhat lower in causing the ON state. In the OFF state, however, the depletion layer can surely be blocked from expanding toward P-type impurity region 6 by the presence of N-type impurity region 7b formed to surround P-type impurity region 6 and N-type impurity region 13 formed to extend from the surface of N⁻ semiconductor layer 2 and reach dielectric portion 3, without lowering of the breakdown voltage of the semiconductor device. Consequently, the breakdown voltage margin is enhanced and the breakdown voltage characteristic of the semiconductor device can further be improved.

In connection with the above-described semiconductor device, it has been described that N-type impurity region 13 as shown in FIG. 3 is applied to the depletion layer block portion. Alternatively, to the depletion layer block portion, the structure as shown in FIG. 10 in which insulating film 14 and conductive portion 15 are formed in the trench may also be applied to surely suppress expansion of the depletion layer without lowering of the breakdown voltage and improve the breakdown voltage characteristic of the semiconductor device. Further, the structure as shown in FIG. 12 in which N-type impurity region 13 is formed along the sidewall of the trench and insulating film 14 is formed in the trench may also be applied to surely suppress expansion of the depletion layer without lowering of the breakdown voltage and improve the breakdown voltage characteristic of the semiconductor device.

Fifth Embodiment

Figure 16:
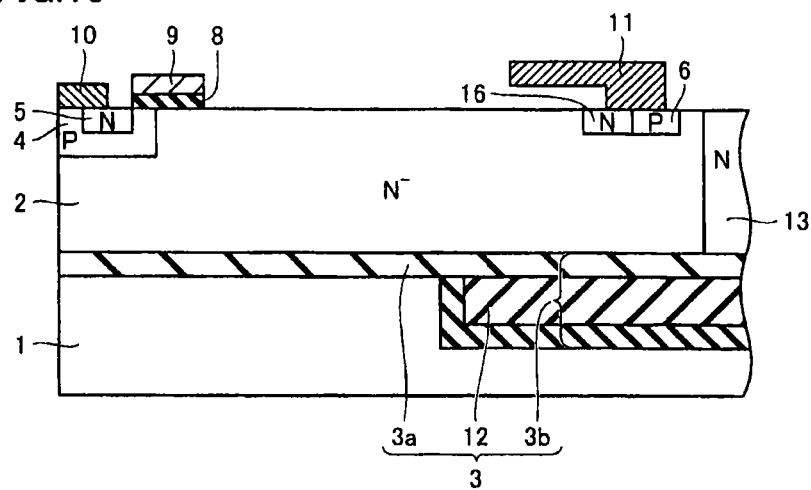
FIG. 16 is a partial cross section showing a semiconductor device according to a fifth embodiment of the present invention.

Here, a fifth example of the IGBT will be described. This semiconductor device corresponds to the semiconductor device shown in FIG. 3 in which N-type impurity region 7 is connected to the collector electrode. As shown in FIG. 16, an N-type impurity region 16 is formed from the surface of N⁻ semiconductor layer 2 to a predetermined depth so that N-type impurity region 16 is electrically connected to collector electrode 11.

In the above-described semiconductor device, a higher voltage than a predetermined threshold voltage applied to gate electrode 9 causes electrons to be injected from N-type impurity region 5 to N⁻ semiconductor layer 2. At this time, because N-type impurity region 16 connected to collector electrode 11 is formed, a part of the injected electrons flows to N-type impurity region 16, namely the semiconductor device operates as a MOSFET. Meanwhile, injection of holes is suppressed. As the amount of electrons injected to N⁻ semiconductor layer 2 gradually increases, holes are also injected from P-type impurity region 6 to N⁻ semiconductor layer 2, so that the semiconductor device operates as an IGBT.

In contrast, a lower voltage than the threshold voltage applied to gate electrode 9 causes injection of electrons to N⁻ semiconductor layer 2 to stop, so that electrons and holes having been accumulated in N⁻ semiconductor layer 2 recombine to thereby disappear, or are discharged to emitter electrode 10 or collector electrode 11 to thereby disappear, to finally cause a state (OFF state) in which the electric current is interrupted. At this time, because the amount of holes injected to N⁻ semiconductor layer 2 is made relatively smaller, the OFF state is caused relatively earlier and thus the operating speed of the semiconductor device can be increased.

Figure 17:
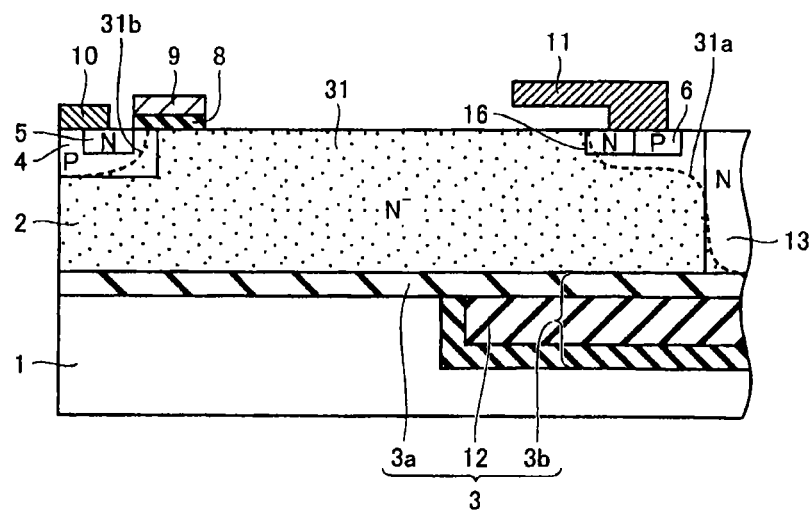
FIG. 17 is a cross section for illustrating how a depletion layer expands while the semiconductor device is in an OFF state in the fifth embodiment.

In the OFF state, a reverse bias is applied and, from the interface between P-type impurity region 4 and N⁻ semiconductor layer 2, a depletion layer expands mainly toward N⁻ semiconductor layer 2. At this time, in Region B as shown in FIG. 17, N-type impurity region 13 is formed as a depletion layer block portion from the surface of N⁻ semiconductor layer 2 to dielectric portion 3. In this way, as described above, depletion layer 31 can surely be blocked from expanding toward P-type impurity region 6, from the portion of N⁻ semiconductor layer 2 that is located below P-type impurity region 6, without lowering of the breakdown voltage of the semiconductor device. Consequently, the breakdown voltage margin is enhanced and the breakdown voltage characteristic of the semiconductor device can further be improved.

It is important for this semiconductor device that the collector electrode is electrically connected to N⁻ semiconductor layer 2 so that electrons injected to N⁻ semiconductor layer 2 directly flow into the collector electrode, in order to allow the semiconductor device to operate in the manner intermediate between a MOSFET and an IGBT. Therefore, the same effect is also achieved even when N-type impurity region 16 is not provided. In this case, N-type impurity region 7 (see FIG. 3) has to be provided as a stopper against a depletion layer.

First Modification

Figure 18:
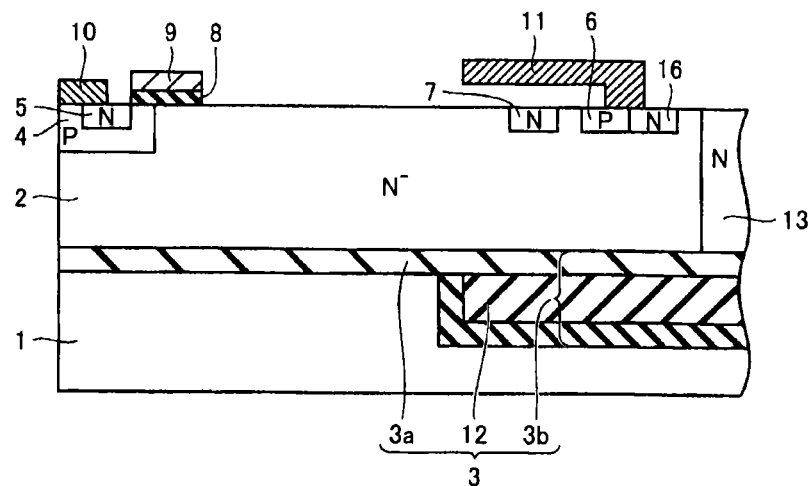
FIG. 18 is a partial cross section showing a semiconductor device of a first modification in the fifth embodiment.

Regarding the semiconductor device above, it has been described that N-type impurity region 16 is arranged on the side where P-type impurity region 4 is located, with respect to P-type impurity region 6 (Arrangement A). Alternatively, the arrangement pattern of N-type impurity region 16 may be the one as shown in FIG. 18 in which N-type impurity region 16 is arranged on the opposite side to side where P-type impurity region 4 is located, with respect to P-type impurity region 6 (Arrangement B). In this case, the route along which electrons injected to $N^-$ semiconductor layer 2 travel to N-type impurity region 16 in an ON operation is somewhat longer than that of Arrangement A, and therefore, the time for which the semiconductor device operates as a MOSFET is relatively shorter and accordingly the time for which the semiconductor device operates as an IGBT is relatively longer.

Figure 19:
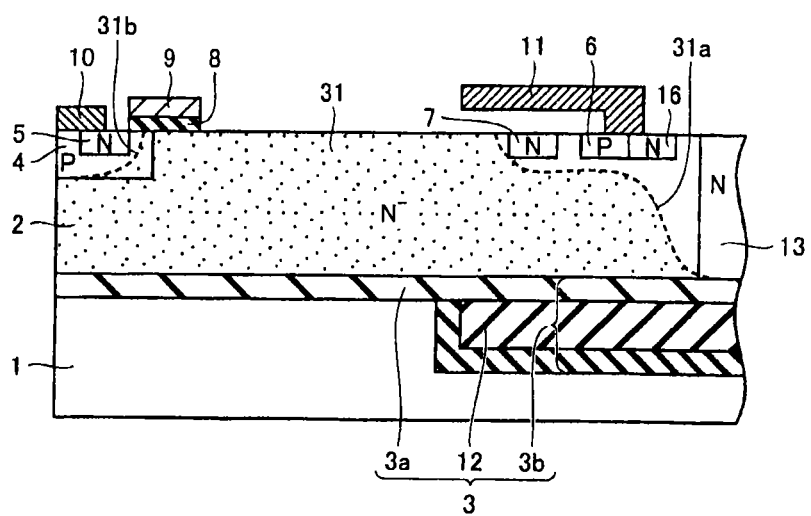
FIG. 19 is a cross section for illustrating how a depletion layer expands while the semiconductor device of the first modification is in an OFF state in the fifth embodiment.

As shown in FIG. 19, in the case of Arrangement B as well, expansion of a depletion layer toward P-type impurity region 6 in an OFF state can surely be blocked by N-type impurity region 13 formed as a depletion layer block portion to extend from the surface of $N^-$ semiconductor layer 2 to dielectric portion 3, without lowering of the breakdown voltage. Consequently, the breakdown voltage margin is enhanced and the breakdown voltage characteristic of the semiconductor device can further be improved.

Second Modification

Figure 20:
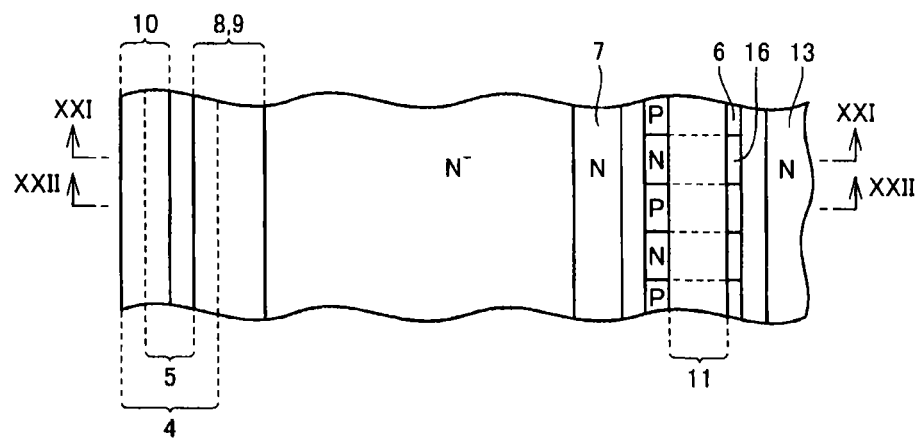
FIG. 20 is a partial plan view showing a semiconductor device of a second modification of the fifth embodiment.
Figure 21:
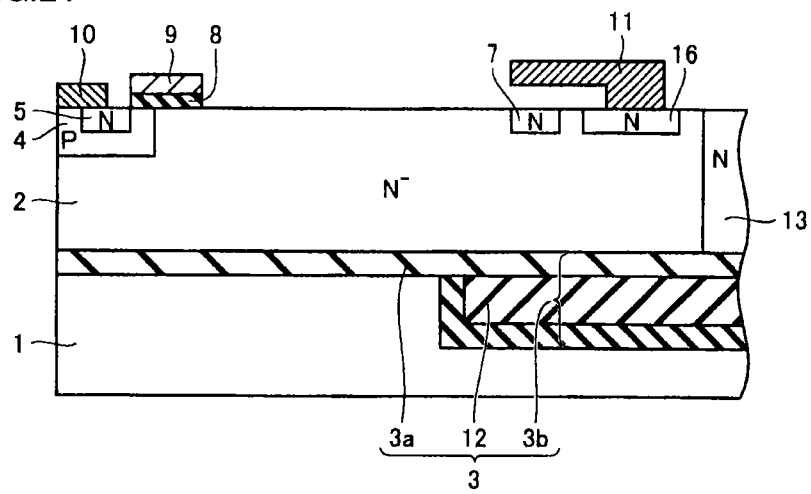
FIG. 21 is a cross section along a line XXI-XXI shown in FIG. 20 in the fifth embodiment.
Figure 22:
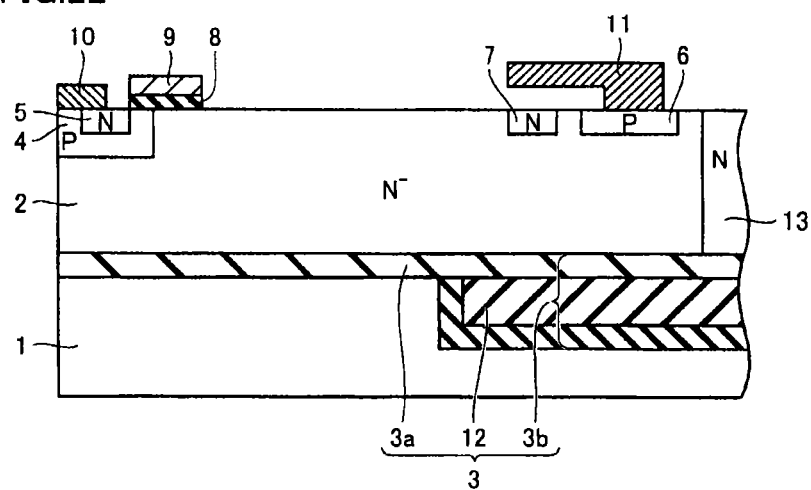
FIG. 22 is a cross section along a line XXII-XXII shown in FIG. 20 in the fifth embodiment.
Figure 23:
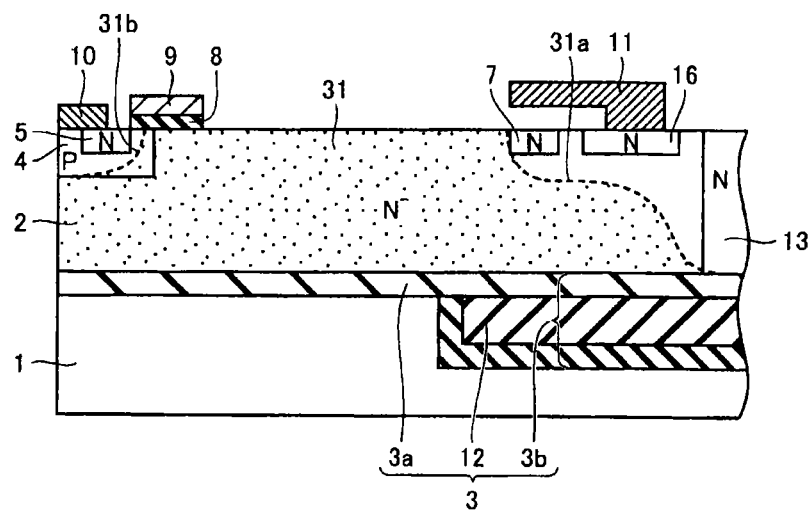
FIGS. 23 and 24 are first and second cross sections respectively for illustrating how a depletion layer expands while the semiconductor device of the second modification is in an OFF state in the fifth embodiment.
Figure 24:
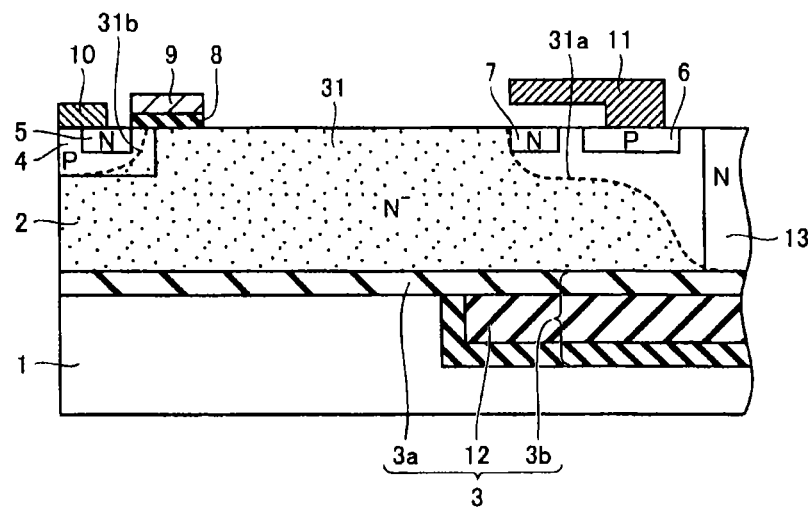

Another arrangement pattern of N-type impurity region 16 may be the one as shown in FIGS. 20, 21, and 22 in which N-type impurity region 16 and P-type impurity region 6 are alternately arranged along the direction in which N-type impurity region 13 extends (Arrangement C). As shown in FIGS. 23 and 24, in the case of Arrangement C as well, expansion of a depletion layer toward P-type impurity region 6 in an OFF state can surely be prevented by N-type impurity region 13 formed as a depletion layer block portion to extend from the surface of $N^-$ semiconductor layer 2 to dielectric portion 3, without lowering of the breakdown voltage. Consequently, the breakdown voltage margin is enhanced and the breakdown voltage characteristic of the semiconductor device can further be improved.

In the semiconductor device of the fifth embodiment, the arrangement pattern, size, or the like of N-type impurity region 16 and P-type impurity region 6 can be varied to change the ratio between the IGBT operation and the MOSFET operation, and a semiconductor device as appropriate for an intended application can be provided.

Regarding the semiconductor device above, it has been described that N-type impurity region 13 shown in FIG. 3 is employed as a depletion layer block portion. Alternatively, as a depletion layer block portion, a structure as shown in FIG. 10 may also be employed in which insulating film 14 and conductive portion 15 are formed in a trench, so that expansion of a depletion layer can surely be suppressed without lowering of the breakdown voltage and the breakdown voltage characteristic of the semiconductor device can be improved. Further, as shown in FIG. 12, N-type impurity region 13 may be formed along the sidewall of a trench and the trench may be filled with insulating film 14 formed therein so as to surely suppress expansion of a depletion layer without lowering of the breakdown voltage and enable improvement of the breakdown voltage characteristic of the semiconductor device.

Sixth Embodiment

Figure 25:
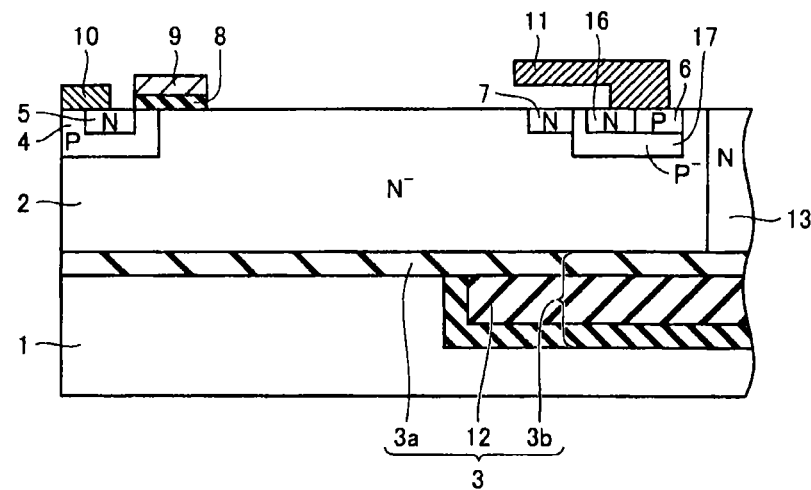
FIG. 25 is a partial cross section showing a semiconductor device according to a sixth embodiment of the present invention.

Here, a sixth example of the IGBT will be described. This semiconductor device corresponds to the semiconductor device shown in FIG. 16 in which a $P^-$ impurity region is formed to surround N-type impurity region 16 and P-type impurity region 6 laterally and from below. Specifically, as shown in FIG. 25, a $P^-$ impurity region 17 is formed from the surface of $N^-$ semiconductor layer 2 to a predetermined depth, so that $P^-$ impurity region 17 surrounds N-type impurity region 16 and P-type impurity region 6 laterally and from below. The impurity concentration of $P^-$ impurity region 17 is set lower than that of P-type impurity region 6.

In the above-described semiconductor device, a higher voltage than a predetermined threshold voltage applied to gate electrode 9 causes electrons to be injected from N-type impurity region 5 to $N^-$ semiconductor layer 2. At this time, because N-type impurity region 16 connected to collector electrode 11 is surrounded by $P^-$ impurity region 17 of a lower impurity concentration, a part of the injected electrons flows through $P^-$ impurity region 17 to N-type impurity region 16. While injection of holes from P-type impurity region 6 to $N^-$ semiconductor layer 2 is suppressed, in contrast to the semiconductor device shown in FIG. 5, $P^-$ impurity region 17 is formed so that injection of holes can be ensured to some extent. In other words, while the semiconductor device shown in FIG. 5 performs a MOSFET operation in an initial period of an ON operation, the present semiconductor device performs an IGBT operation from the start.

In contrast, a lower voltage than the threshold voltage applied to gate electrode 9 causes injection of electrons to $N^-$ semiconductor layer 2 to stop, so that electrons and holes having been accumulated in $N^-$ semiconductor layer 2 recombine to thereby disappear, or are discharged to emitter electrode 10 or collector electrode 11 to thereby disappear, to finally cause a state (OFF state) in which the electric current is interrupted. At this time, because the amount of holes injected to $N^-$ semiconductor layer 2 is made relatively smaller, the OFF state is caused relatively earlier and thus the operating speed of the semiconductor device can be increased.

Figure 26:
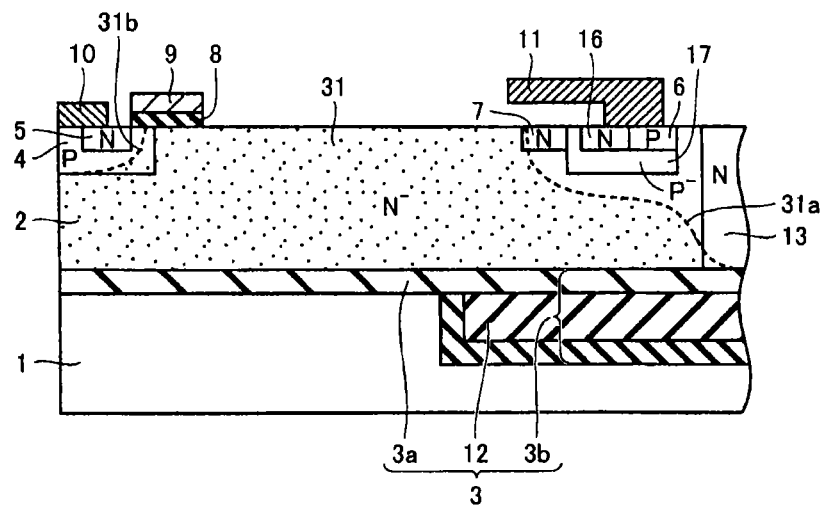
FIG. 26 is a cross section for illustrating how a depletion layer expands while the semiconductor device is in an OFF state in the sixth embodiment.

In the OFF state, a reverse bias is applied and, from the interface between P-type impurity region 4 and $N^-$ semiconductor layer 2, a depletion layer expands mainly toward $N^-$ semiconductor layer 2. At this time, in Region B as shown in FIG. 26, N-type impurity region 13 is formed as a depletion layer block portion from the surface of $N^-$ semiconductor layer 2 to dielectric portion 3. In this way, as described above, depletion layer 31 can surely be blocked from expanding toward P-type impurity region 6, from the portion of $N^-$ semiconductor layer 2 that is located below P-type impurity region 6, without lowering of the breakdown voltage of the semiconductor device. Consequently, the breakdown voltage margin is enhanced and the breakdown voltage characteristic of the semiconductor device can further be improved.

Since it is important for this semiconductor device that electrons injected to $N^-$ semiconductor layer 2 directly flow into collector electrode 11, a similar effect may also be achieved even when N-type impurity region 16 is not provided.

First Modification

Figure 27:
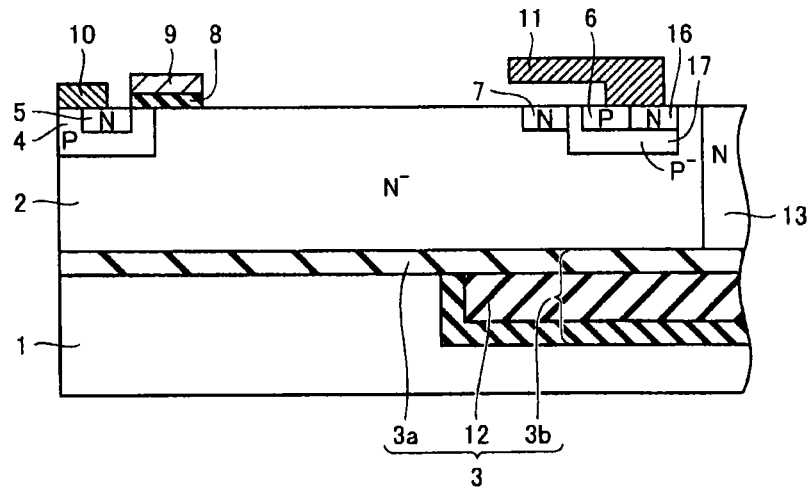
FIG. 27 is a partial cross section showing a semiconductor device of a first modification in the sixth embodiment.

Regarding the semiconductor device above, it has been described that N-type impurity region 16 is arranged on the side where P-type impurity region 4 is located, with respect to P-type impurity region 6 (Arrangement A). Alternatively, the arrangement pattern of N-type impurity region 16 may be the one as shown in FIG. 27 in which N-type impurity region 16 is arranged on the opposite side to side where P-type impurity region 4 is located, with respect to P-type impurity region 6 (Arrangement B).

Figure 28:
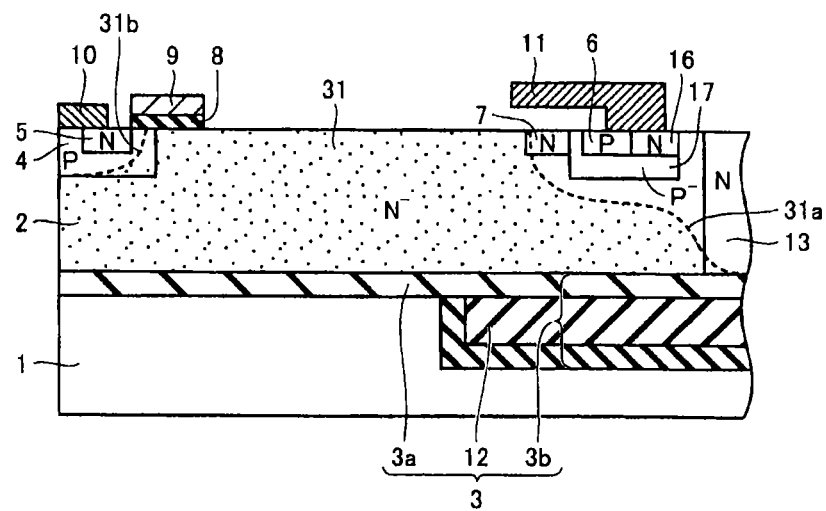
FIG. 28 is a cross section for illustrating how a depletion layer expands while the semiconductor device of the first modification is in an OFF state in the sixth embodiment.

As shown in FIG. 28, in the case of Arrangement B as well, expansion of a depletion layer toward P-type impurity region 6 in an OFF state can surely be blocked by N-type impurity region 13 formed as a depletion layer block portion to extend from the surface of N⁻ semiconductor layer 2 to dielectric portion 3, without lowering of the breakdown voltage. Consequently, the breakdown voltage margin is enhanced and the breakdown voltage characteristic of the semiconductor device can further be improved.

Second Modification

Figure 29:
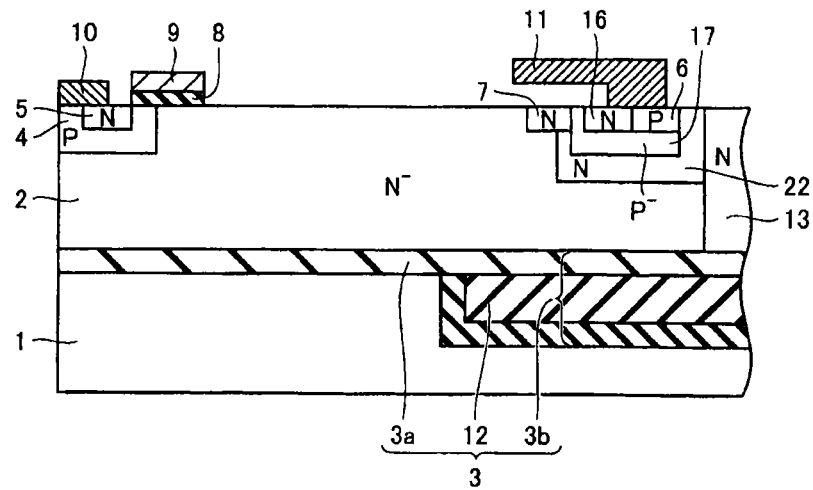
FIG. 29 is a partial cross section showing a semiconductor device of a second modification in the sixth embodiment.

Further, as shown in FIG. 29, an N-type impurity region 22 may also be formed from the surface of N⁻ semiconductor layer 2 to a predetermined depth so that N-type impurity region 22 surrounds P⁻ impurity region 17 laterally and from below.

Figure 30:
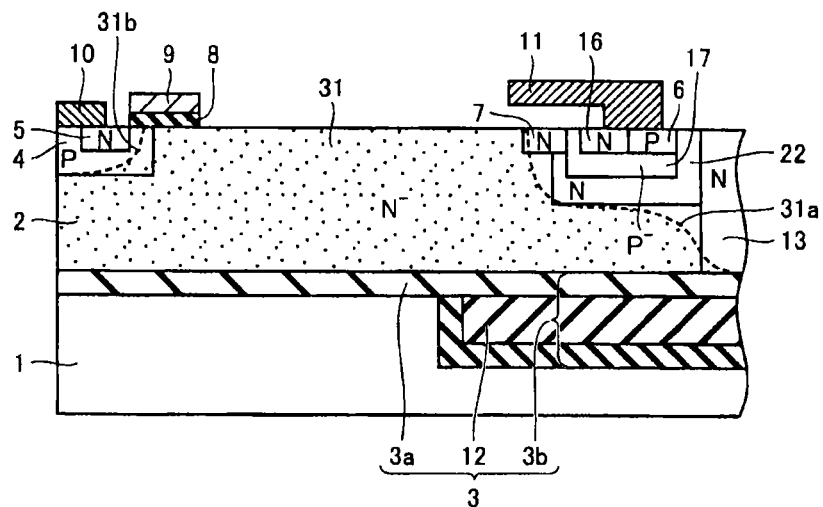
FIG. 30 is a cross section for illustrating how a depletion layer expands while the semiconductor device of the second modification is in an OFF state in the sixth embodiment.
Figure 31:
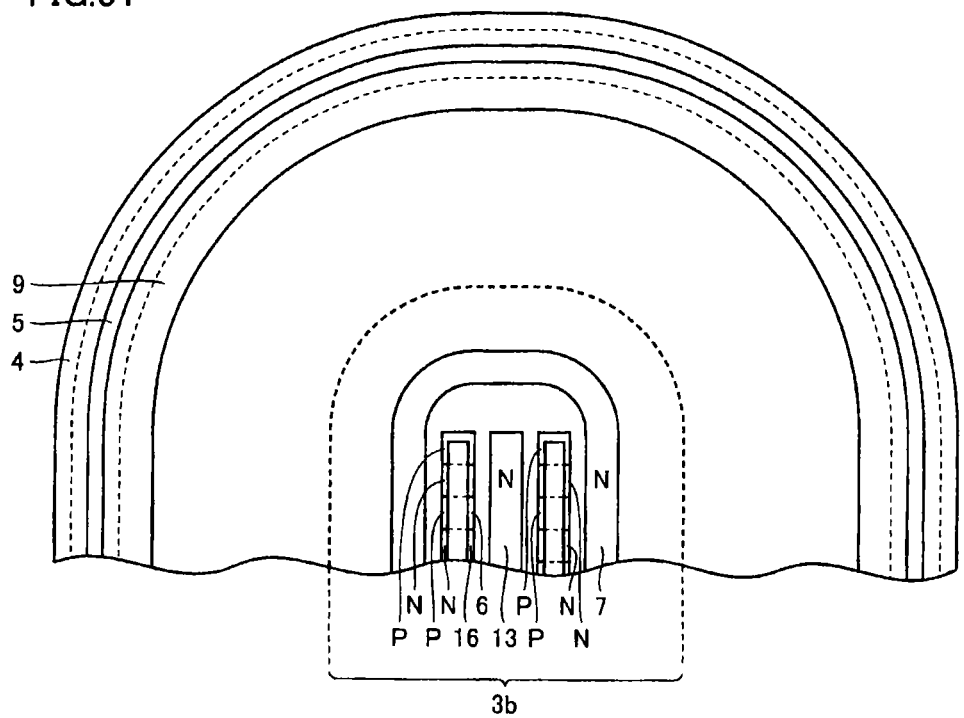
FIG. 31 is a partial plan view showing a semiconductor device of a third modification in the sixth embodiment.
Figure 32:
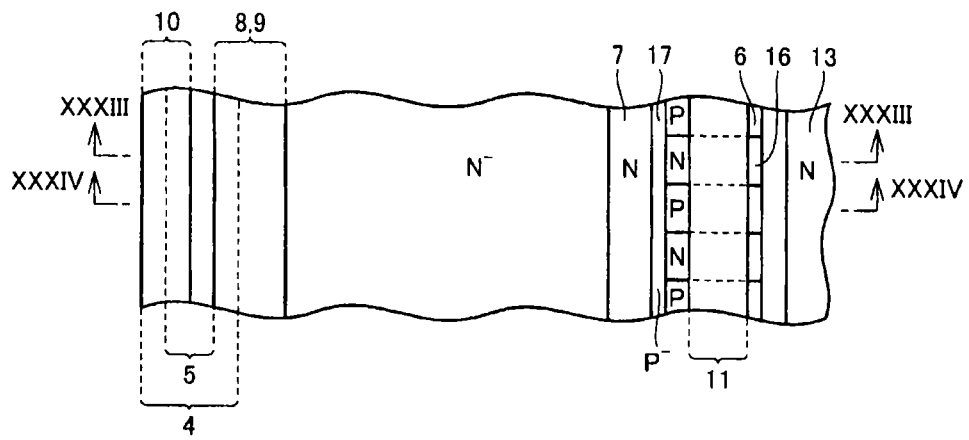
FIG. 32 is a partial enlarged plan view showing a semiconductor device of the third modification in the sixth embodiment.
Figure 33:
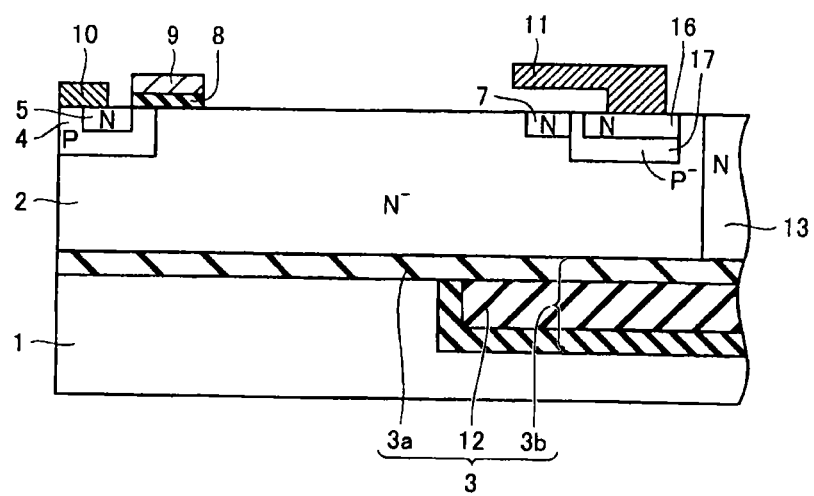
FIG. 33 is a partial cross section along a line XXXIII-XXXIII shown in FIG. 32 in the sixth embodiment.
Figure 34:
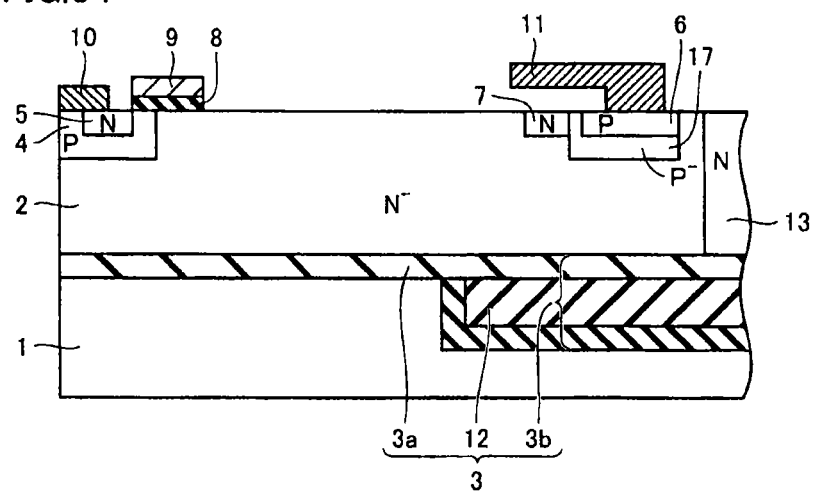
FIG. 34 is a partial cross section along a line XXXIV-XXXIV shown in FIG. 32 in the sixth embodiment.

In this case, as shown in FIG. 30, expansion of a depletion layer toward P-type impurity region 6 in an OFF state can surely be prevented by N-type impurity region 22 formed to surround P⁻ impurity region 17 and N-type impurity region 13 formed as a depletion layer block portion to extend from the surface of N⁻ semiconductor layer 2 to dielectric portion 3, without lowering of the breakdown voltage. Consequently, the breakdown voltage margin is enhanced and the breakdown voltage characteristic of the semiconductor device can further be improved. It is noted that, in the structure shown in FIG. 29, the location of N-type impurity region 16 and the location of P-type impurity region 6 may be replaced with each other as shown in FIG. 27. In this case as well, the breakdown voltage characteristic of the semiconductor device can be improved.

Third Modification

Figure 35:
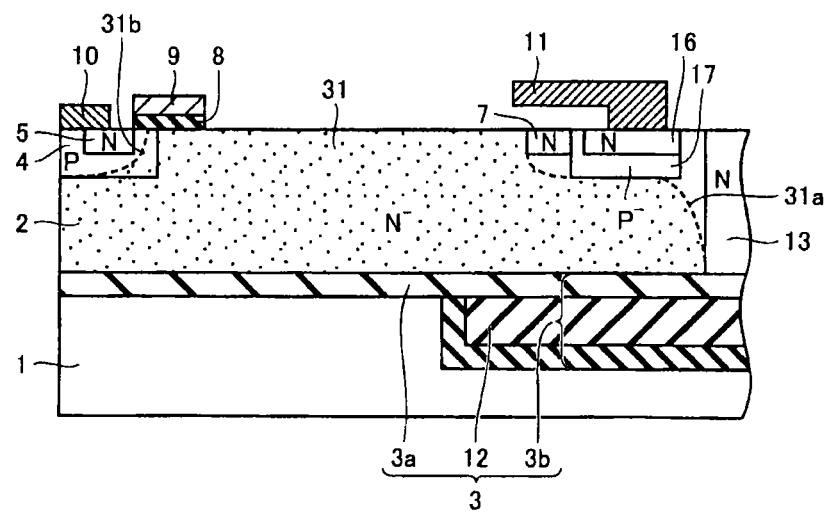
FIGS. 35 and 36 are first and second cross sections respectively for illustrating how a depletion layer expands while the semiconductor device of the third modification is in an OFF state in the sixth embodiment.
Figure 36:
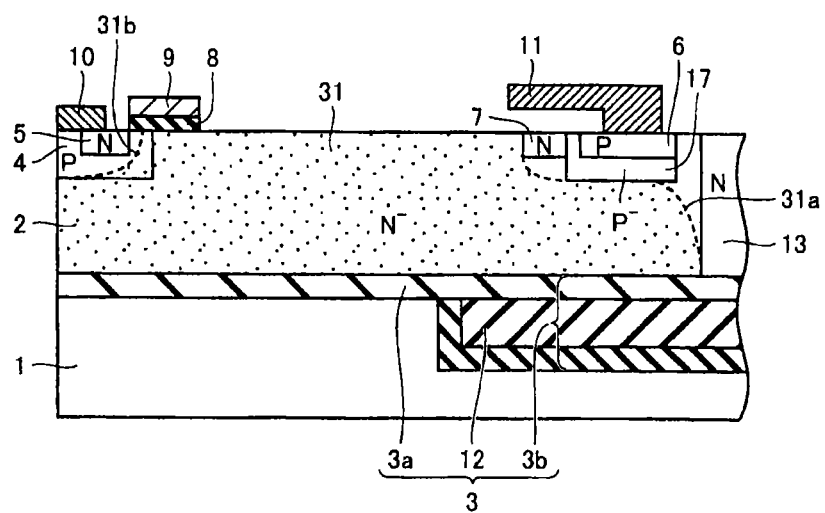

Another arrangement pattern of N-type impurity region 16 and P-type impurity region 6 may be the one as shown in FIGS. 31, 32, 33, and 34 in which N-type impurity region 16 and P-type impurity region 6 are alternately arranged along the direction in which N-type impurity region 13 extends (Arrangement C). As shown in FIGS. 35 and 36, in the case of Arrangement C as well, expansion of a depletion layer toward P-type impurity region 6 in an OFF state can surely be prevented by N-type impurity region 13 formed as a depletion layer block portion to extend from the surface of N⁻ semiconductor layer 2 to dielectric portion 3, without lowering of the breakdown voltage. Consequently, the breakdown voltage margin is enhanced and the breakdown voltage characteristic of the semiconductor device can further be improved.

Regarding the semiconductor device above, it has been described that N-type impurity region 13 shown in FIG. 3 is employed as a depletion layer block portion. Alternatively, as a depletion layer block portion, a structure as shown in FIG. 10 may also be employed in which insulating film 14 and conductive portion 15 are formed in a trench. In this case as well, expansion of a depletion layer can surely be suppressed without lowering of the breakdown voltage and the breakdown voltage characteristic of the semiconductor device can be improved. Further, as shown in FIG. 12, N-type impurity region 13 may be formed along the sidewall of a trench and the trench may be filled with insulating film 14. In this case as well, expansion of a depletion layer can surely be suppressed without lowering of the breakdown voltage, and the breakdown voltage characteristic of the semiconductor device can be improved.

Seventh Embodiment

Figure 37:
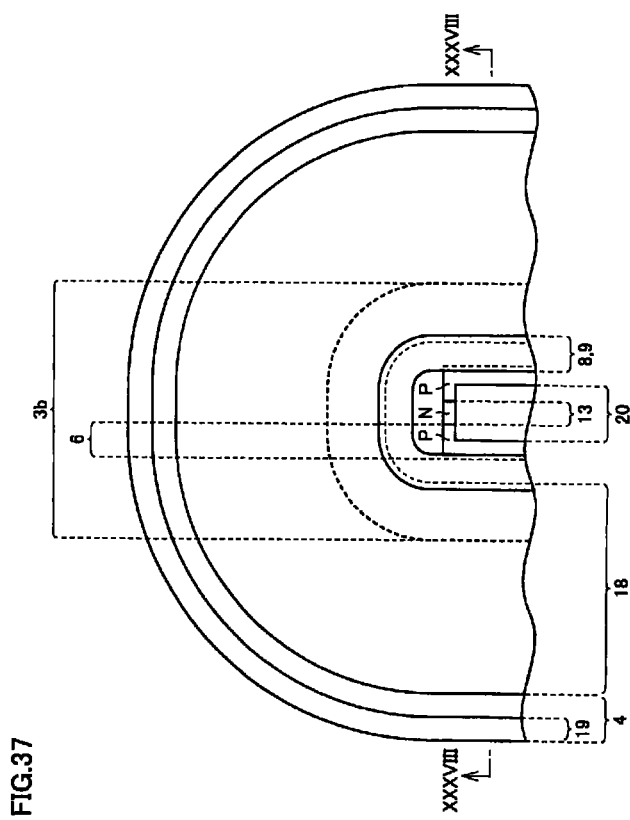
FIG. 37 is a partial plan view showing a semiconductor device according to a seventh embodiment of the present invention.
Figure 38:
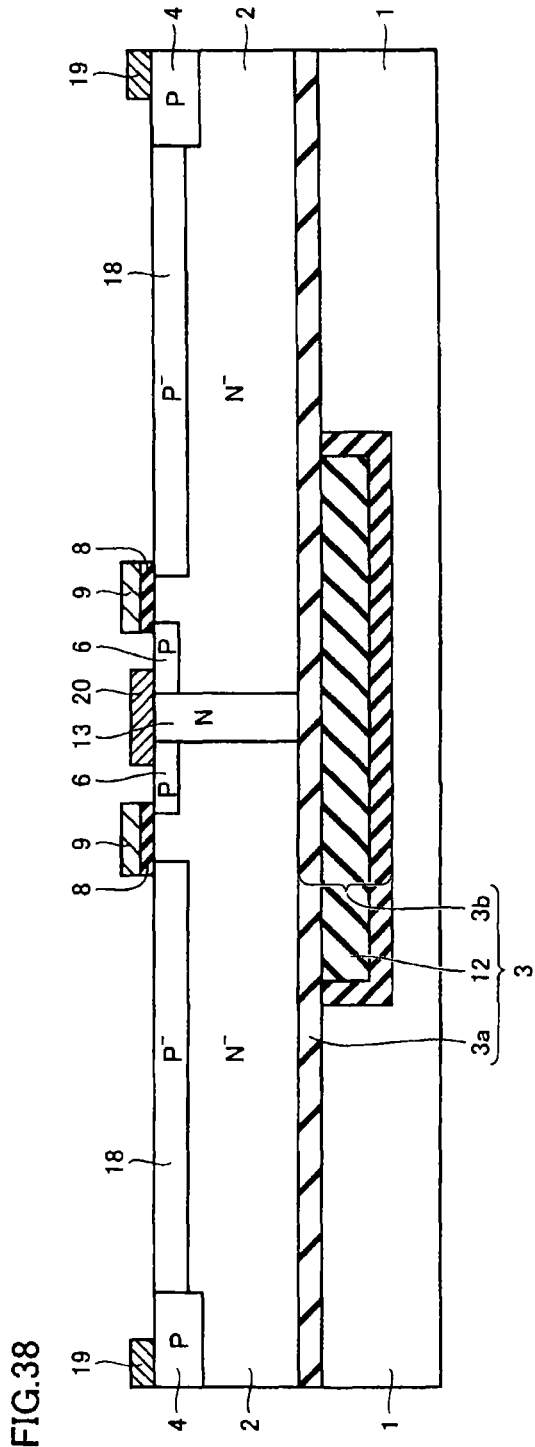
FIG. 38 is a cross section along a line XXXVIII-XXXVIII shown in FIG. 37 in the seventh embodiment.

Here, a first example of a p-channel MOS transistor (PMOS) applied to an inverter circuit will be described. As shown in FIGS. 37 and 38, a dielectric portion 3 is formed to contact a main surface of a semiconductor substrate 1. Dielectric portion 3 includes a relatively thin portion 3a and a relatively thick portion 3b. An N⁻ semiconductor layer 2 of a predetermined thickness is formed to contact a surface of dielectric portion 3. N⁻ semiconductor layer 2 has an impurity concentration of approximately $5 \times 10^{14}/cm^3$ to $5 \times 10^{15}/cm^3$, for example. In a region (Region A) of N⁻ semiconductor layer 2 that is located directly above relatively thin portion 3a of dielectric portion 3, a P-type impurity region 4 is formed from a surface of N⁻ semiconductor layer 2 to a predetermined depth. P-type impurity region 4 has an impurity concentration of approximately $1 \times 10^{16}/cm^3$ to $1 \times 10^{19}/cm^3$, for example. A drain electrode 19 is formed to contact P-type impurity region 4. Further, a P⁻ impurity region 18 abutting on P-type impurity region 4 and having a lower impurity concentration than the impurity concentration of P-type impurity region 4 is formed from the surface of N⁻ semiconductor layer 2 to a predetermined depth. P⁻ impurity region 18 has an impurity concentration of approximately $2 \times 10^{15}/cm^3$ to $2 \times 10^{16}/cm^3$, for example.

In a region (Region B) of N⁻ semiconductor layer 2 that is located at a distance from P⁻ impurity region 18 and directly above relatively thick portion 3b of dielectric portion 3, a P-type impurity region 6 is formed from the surface of N⁻ semiconductor layer 2 to a predetermined depth. A source electrode 20 is formed to contact P-type impurity region 6. Further, on a surface of a portion of N⁻ semiconductor layer 2 that is located between P⁻ impurity region 18 and P-type impurity region 6, a gate electrode 9 is formed with a gate insulating film 8 interposed between the surface and the gate electrode. Furthermore, in Region B, an N-type impurity region 13 having a higher impurity concentration than that of N⁻ semiconductor layer 2 is formed as a depletion layer block portion to extend from the surface of N⁻ semiconductor layer 2 and reach dielectric portion 3.

As shown in FIG. 37, N-type impurity region 13 is formed to extend along one direction. P-type impurity region 6 is disposed along N-type impurity region 13. Gate electrode 9 is formed to circumferentially surround P-type impurity region 6 as seen in a plan view.

Next, an operation of the above-described semiconductor device (PMOS) will be described. A voltage lower by a predetermined potential than a source potential applied to gate electrode 9 causes a channel to be formed in a portion of N⁻ semiconductor layer 2 that is located directly below gate electrode 9. With the channel thus formed, a state in which electric current flows from source electrode 20 to drain electrode 19 is caused (ON state).

In contrast, an increased potential applied to gate electrode 9 causes the channel formed in N⁻ semiconductor layer 2 to disappear and thereby causes an OFF state. At this time, while the potential of drain electrode 19 is substantially equal to a ground potential, a voltage of about 500 to 600 V for example is applied to source electrode 20.

Figure 39:
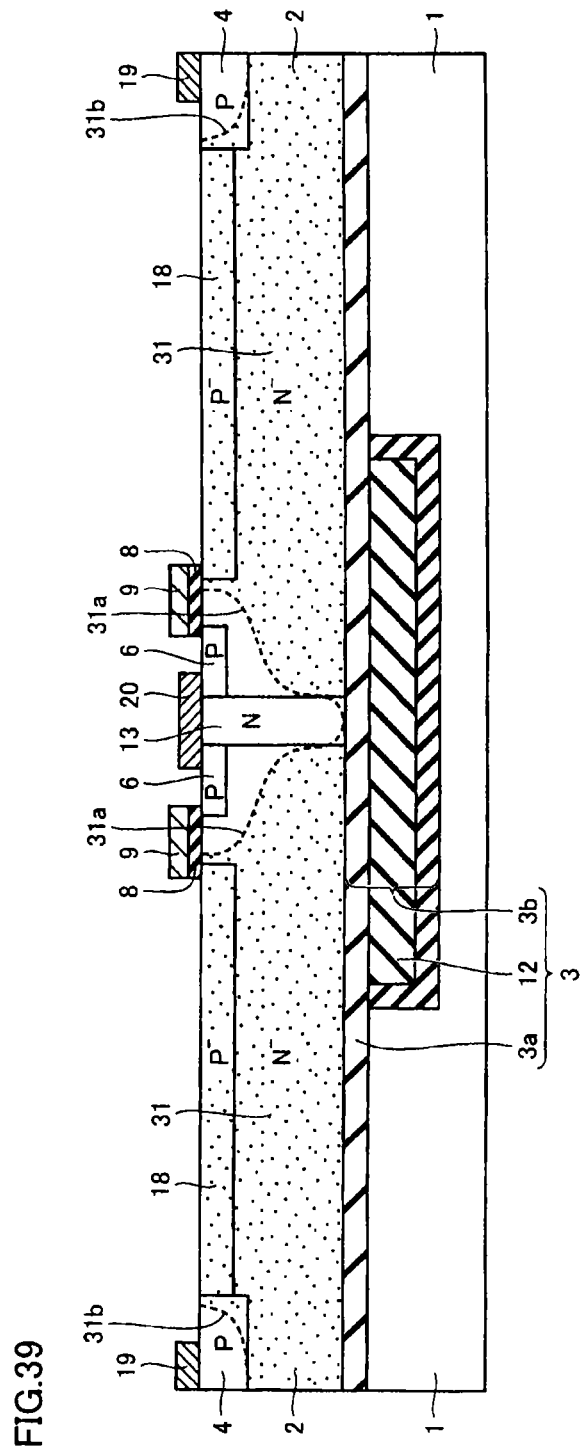
FIG. 39 is a cross section for illustrating how a depletion layer expands while the semiconductor device is in an OFF state in the seventh embodiment.

Consequently, as shown in FIG. 39, a reverse bias is applied and a depletion layer 31 expands from the interface between P-type impurity region 4, P⁻ impurity region 18, and N⁻ semiconductor layer 2. As shown in FIG. 39, depletion layer 31 chiefly expands toward N⁻ semiconductor layer 2 of a relatively low impurity concentration, and a depletion-layer end 31a extends to reach near the region where N-type impurity region 7 serving as a stopper against the depletion layer is located. In particular, in the above-described semiconductor device, N-type impurity region 13 extending from the surface of N⁻ semiconductor layer 2 to reach dielectric portion 3 is formed to surely prevent depletion layer 31 from expanding to P-type impurity region 6 without lowering of the breakdown voltage and enable improvement of the breakdown voltage characteristic of the semiconductor device. This will further be described with reference to a comparative example.

Figure 40:
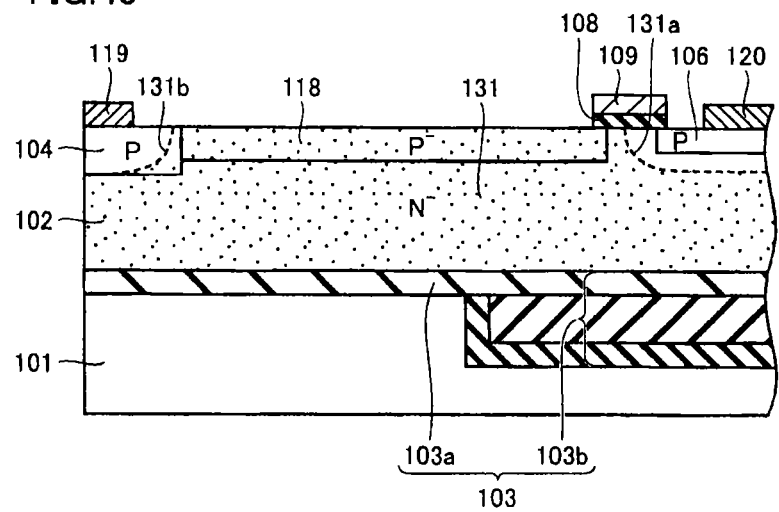
FIG. 40 is a partial cross section for illustrating how a depletion layer expands while a semiconductor device of a comparative example is in an OFF state.

A semiconductor device of the comparative example is configured similarly to the semiconductor device shown exemplarily in FIG. 38, except that N-type impurity region 13 extending from the surface of N⁻ semiconductor layer 2 to reach dielectric portion 3 is not formed. As shown in FIG. 40, a dielectric portion 103 including a relatively thin portion 103a and a relatively thick portion 103b is formed to contact a main surface of a semiconductor substrate 101. An N⁻ semiconductor layer 102 of a predetermined thickness is formed to contact a surface of dielectric portion 103.

In a predetermined region of N⁻ semiconductor layer 102, a P-type impurity region 104 is formed from a surface of N⁻ semiconductor layer 102 to a predetermined depth. A drain electrode 119 is formed to contact P-type impurity region 104. Further, from the surface of N⁻ semiconductor layer 102 to a predetermined depth, a P⁻ impurity region 118 having a lower impurity concentration than that of P-type impurity region 104 is formed to contact P-type impurity region 104.

In a predetermined region of N⁻ semiconductor layer 102 that is located at a distance from P⁻ impurity region 118, a P-type impurity region 106 is formed from the surface of N⁻ semiconductor layer 102 to a predetermined depth. On a surface of a portion of N⁻ semiconductor layer 102 that is located between P⁻ impurity region 118 and P-type impurity region 106, a gate electrode 109 is formed with a gate insulating film 108 interposed between the surface and the gate electrode. A source electrode 120 is formed to contact P-type impurity region 106.

In the semiconductor device of the comparative example, a voltage lower by a predetermined potential than a source potential that is applied to gate electrode 109 causes an ON state. In contrast, an increased potential applied to gate electrode 109 causes an OFF state. At this time, as shown in FIG. 40, a reverse bias is applied and, from the interface between P-type impurity region 104, P⁻ impurity region 118, and N⁻ semiconductor layer 102, a depletion layer 131 expands. In a region of N⁻ semiconductor layer 102 that is located below P-type impurity region 106, depletion-layer end 131a reaches near P-type impurity region 106.

Therefore, the breakdown voltage of the semiconductor device in this comparative example is determined by the punch-through phenomenon or the like in which depletion-layer end 131a contacts P-type impurity region 106, or determined by a leakage current of a parasitic PNP transistor formed of P-type impurity region 104, N⁻ semiconductor layer 102, and P-type impurity region 106. Usually, in order to address this malfunction, an N-type impurity region is formed to surround P-type impurity region 6. The N-type impurity region thus formed, however, could increase the impurity concentration in the surface of N⁻ semiconductor layer 102 and increase a threshold voltage Vth. Thus, a further improvement of the breakdown voltage characteristic has its limit.

In contrast, the above-described semiconductor device has an essential feature that P-type impurity region 6 to which a high voltage is applied is formed in the region of N⁻ semiconductor layer 2 that is located directly above relatively thick portion 3b of dielectric portion 3, similarly to the semiconductor device shown in FIG. 3. Accordingly, a voltage drop in the dielectric portion (portion 3b) can be further increased and a voltage drop in the portion of N⁻ semiconductor layer 2 that is located in this region can further be decreased. While expansion of a depletion layer toward P-type impurity region 6 connected to source electrode 20 is suppressed, decrease of the breakdown voltage of the semiconductor device can still be suppressed. Further, no increase of threshold voltage Vth occurs.

The above-described semiconductor device includes N-type impurity region 13 as a depletion layer block portion suppressing expansion of such a depletion layer. N-type impurity region 13 has a higher impurity concentration than that of N⁻ semiconductor layer 2, and is formed to extend from the surface of N⁻ semiconductor layer 2 to dielectric portion 3 (portion 3b). Thus, expansion of depletion layer 31 toward P-type impurity region 6, from a portion of N⁻ semiconductor layer 2 that is located below P-type impurity region 6 can surely be blocked without lowering of the breakdown voltage of the semiconductor device. Consequently, the breakdown voltage margin is enhanced and the breakdown voltage characteristic of the semiconductor device can further be improved.

First Modification

Figure 41:
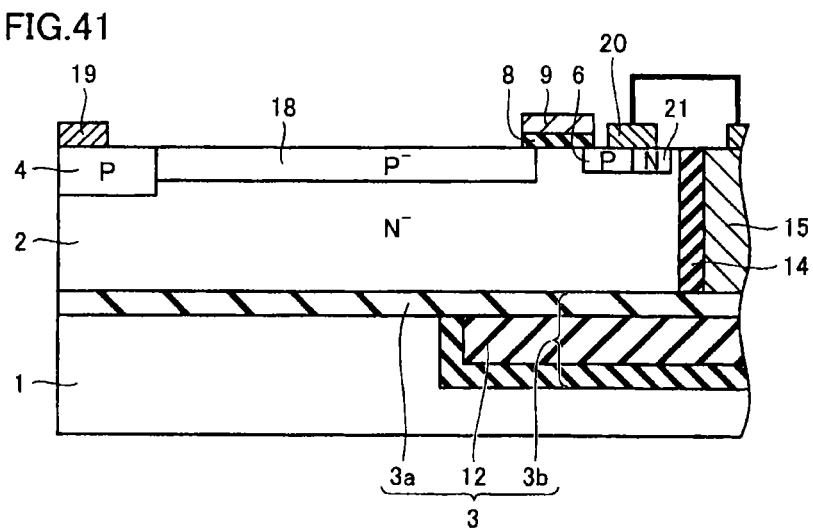
FIG. 41 is a partial cross section showing a semiconductor device of a first modification in the seventh embodiment.

Regarding the semiconductor device above, it has been described that N-type impurity region 13 extending from the surface of N⁻ semiconductor layer 2 to reach dielectric portion 3 is employed as an example of the depletion layer block portion. Alternatively, as the depletion layer block portion, a structure as shown in FIG. 10 may also be employed in which insulating film 14 and conductive portion 15 are formed in a trench. In this case, as shown in FIG. 41, an N-type impurity region 21 is formed from the surface of N⁻ semiconductor layer 2 to a predetermined depth. Further, source electrode 20 is formed to contact this N-type impurity region and P-type impurity region 6. Conductive portion 15 formed with interposed insulating film 14 in the trench and source electrode 20 are electrically connected.

Figure 42:
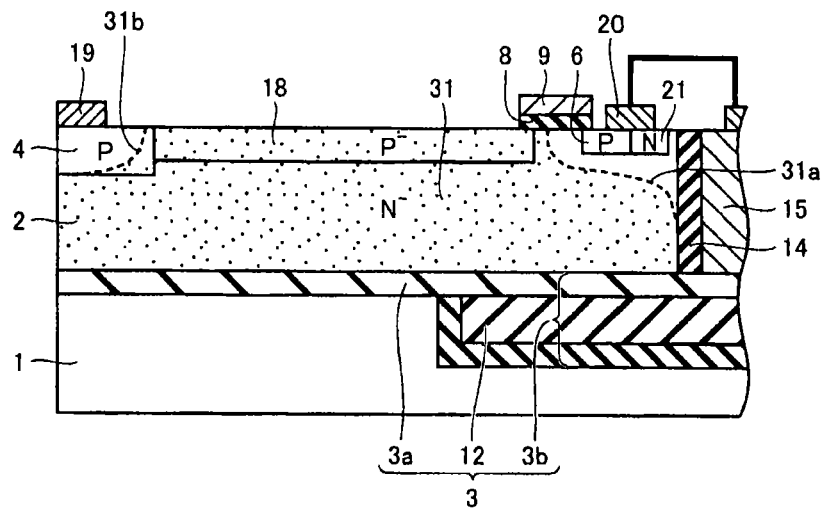
FIG. 42 is a cross section for illustrating how a depletion layer expands while the semiconductor device of the first modification is in an OFF state in the seventh embodiment.

As shown in FIG. 42, in this semiconductor device as well, expansion of depletion layer 31 in an OFF state toward P-type impurity region 6 from the portion of N⁻ semiconductor layer 2 that is located below P-type impurity region 6 can be blocked without lowering of the breakdown voltage. Consequently, the breakdown voltage margin is enhanced and the breakdown voltage characteristic of the semiconductor device can further be improved.

Second Modification

Figure 43:
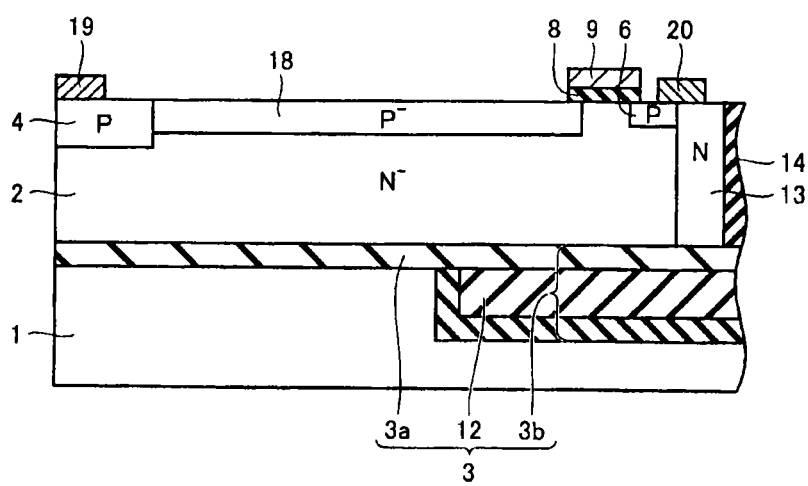
FIG. 43 is a partial cross section showing a semiconductor device of a second modification in the seventh embodiment.

As the depletion layer block portion, a structure as shown in FIG. 12 may also be employed in which N-type impurity region 13 is formed along the sidewall of a trench and the trench is filled with insulating film 14 formed therein. In this case, as shown in FIG. 43, source electrode 20 is formed to contact N-type impurity region 13 formed along the sidewall of the trench and P-type impurity region 6.

Figure 44:
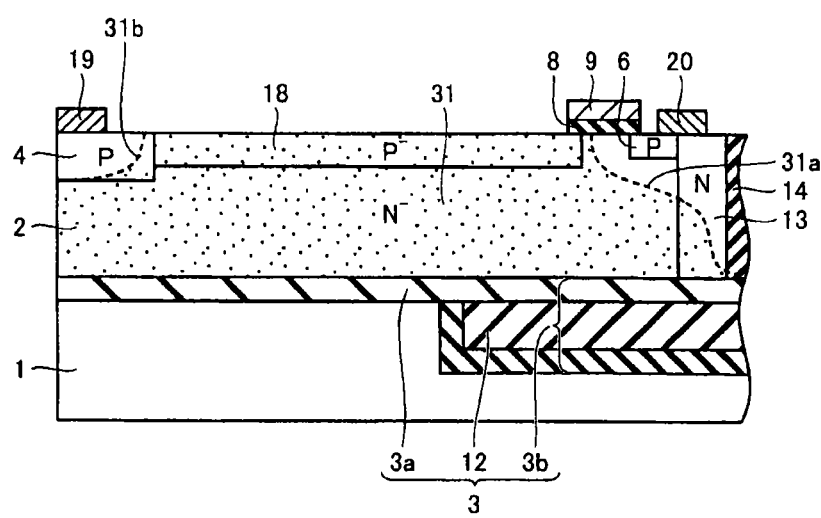
FIG. 44 is a cross section for illustrating how a depletion layer expands while the semiconductor device of the second modification is in an OFF state in the seventh embodiment.

As shown in FIG. 44, in this semiconductor device as well, expansion of depletion layer 31 in an OFF state toward P-type impurity region 6 from the portion of N⁻ semiconductor layer 2 that is located below P-type impurity region 6 can be blocked without lowering of the breakdown voltage. Consequently, the breakdown voltage margin is enhanced and the breakdown voltage characteristic of the semiconductor device can further be improved.

Eighth Embodiment

Figure 45:
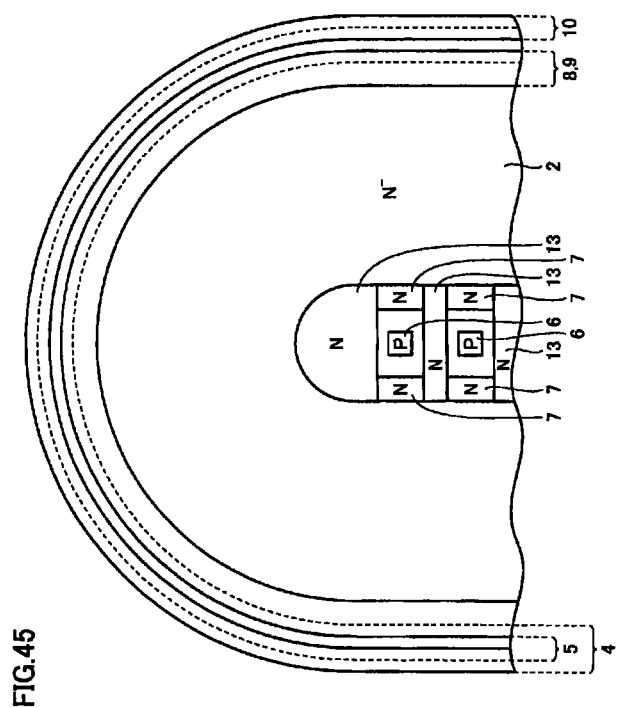
FIG. 45 is a partial plan view showing a semiconductor device according to an eighth embodiment of the present invention.
Figure 46:
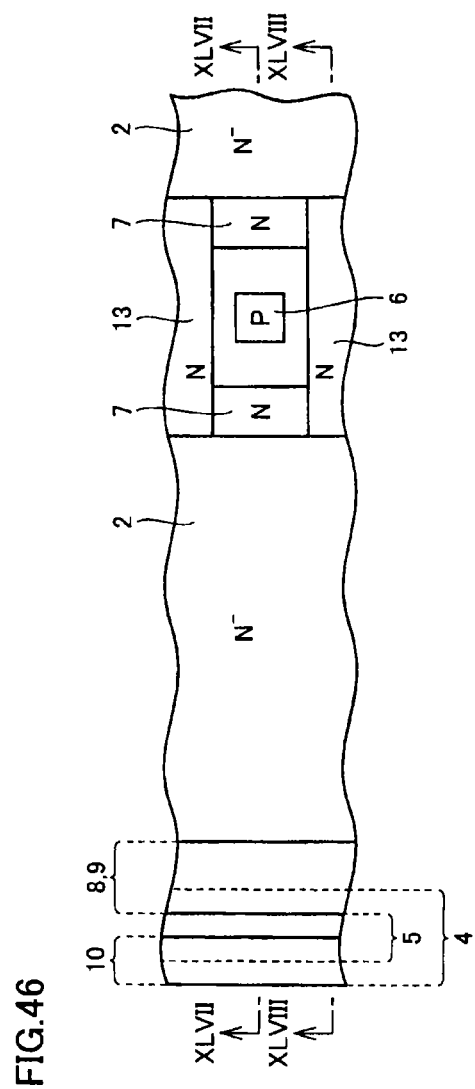
FIG. 46 is a partial enlarged plan view showing the semiconductor device in the eighth embodiment.
Figure 47:
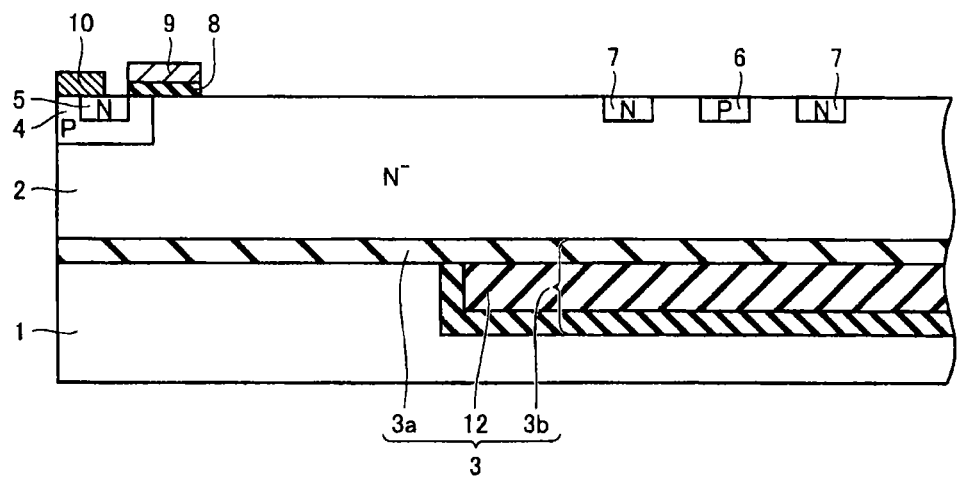
FIG. 47 is partial cross section along a line XLVII-XLVII shown in FIG. 46 in the eighth embodiment.
Figure 48:
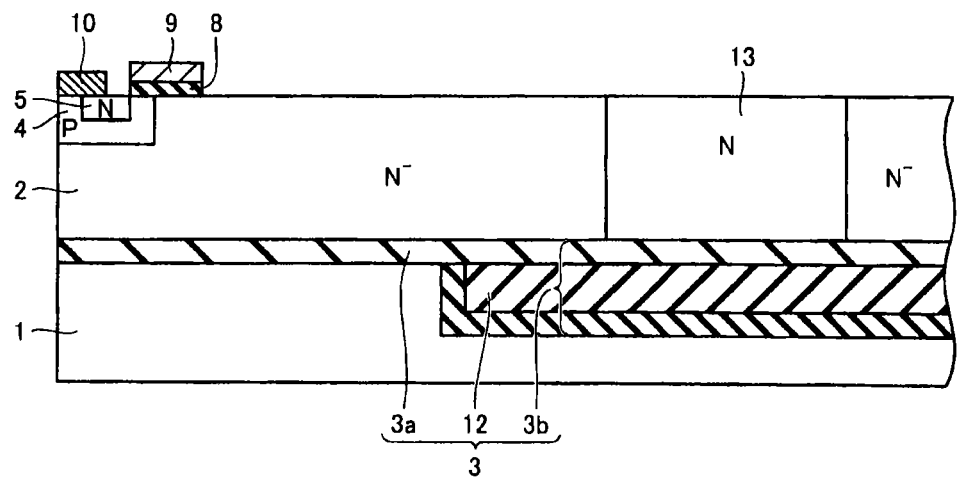
FIG. 48 is partial cross section along a line XLVIII-XLVIII shown in FIG. 46 in the eighth embodiment.

Here, a variation of the two-dimensional structure as seen in a plan view of the semiconductor device shown in FIG. 3 will be described. As shown in FIG. 45, P-type impurity region 6 to which the collector electrode is connected and N-type impurity region 13 serving as a depletion layer block portion are alternately arranged along one direction. As shown in FIGS. 46 and 47, P-type impurity region 6 is formed from the surface of N⁻ semiconductor layer 2 to a predetermined depth. Further, as shown in FIGS. 46 and 48, N-type impurity region 13 is formed from the surface of N⁻ semiconductor layer 2 to reach dielectric portion 3. Except for the above, the structure of this semiconductor device is similar to the semiconductor device shown exemplarily in FIG. 3, and therefore, the same components are denoted by the same reference characters and the description thereof will not be repeated.

In the above-described semiconductor device, a higher voltage than a predetermined threshold voltage applied to gate electrode 9 causes electrons and holes to be injected to N⁻ semiconductor layer 2, so that the resistance value of N⁻ semiconductor layer 2 decreases due to conductivity modulation to cause a state (ON state) in which electric current flows from the collector side toward the emitter side.

In contrast, a lower voltage than the threshold voltage applied to gate electrode 9 causes injection of electrons to N⁻ semiconductor layer 2 to stop, so that electrons and holes having been accumulated in N⁻ semiconductor layer 2 recombine to thereby disappear, or are discharged to emitter electrode 10 or collector electrode 11 to thereby disappear, to finally cause a state (OFF state) in which the electric current is interrupted. In the OFF state, a reverse bias is applied and, from the interface between P-type impurity region 4 and N⁻ semiconductor layer 2, a depletion layer expands mainly toward N⁻ semiconductor layer 2.

Figure 49:
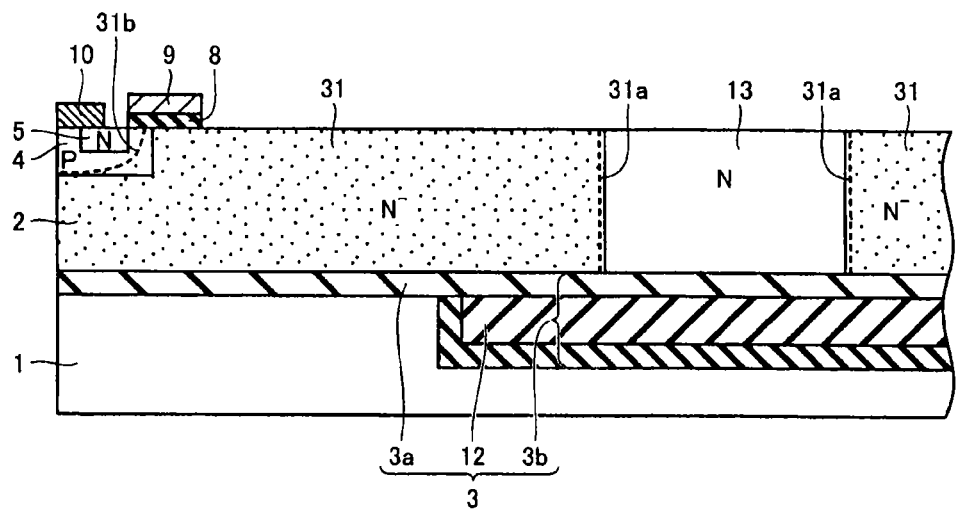
FIGS. 49 and 50 are first and second cross sections respectively for illustrating how a depletion layer expands while the semiconductor device is in an OFF state in the eighth embodiment.
Figure 50:
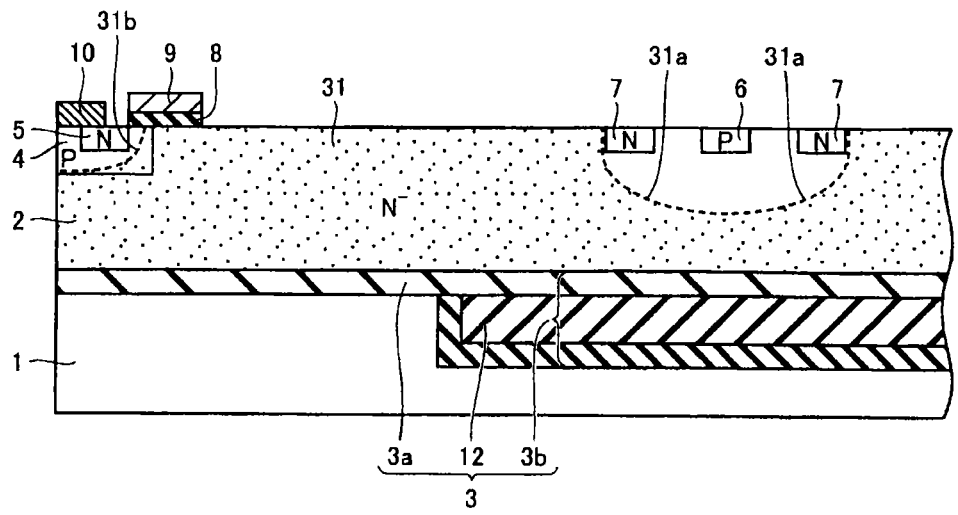

At this time, as shown in FIG. 49, in a portion where N-type impurity region 13 is disposed, expansion of a depletion layer can be blocked (depletion-layer end 31a) by N-type impurity region 13 without lowering of the breakdown voltage. Accordingly, as shown in FIG. 50, in a portion where P-type impurity region 6 is disposed to be sandwiched between N-type impurity regions 13, expansion of the depletion layer toward P-type impurity region 6 can be blocked (depletion-layer end 31a) without lowering of the breakdown voltage, in contrast to the case where such an N-type impurity region is not disposed. Consequently, the breakdown voltage margin is enhanced and the breakdown voltage characteristic of the semiconductor device can further be improved.

First Modification

Figure 51:
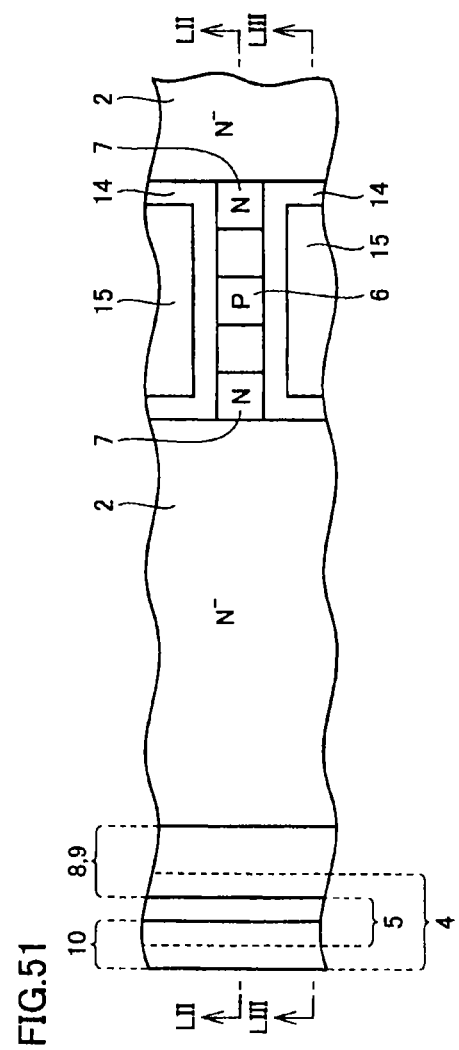
FIG. 51 is a partial enlarged plan view showing a semiconductor device of a first modification in the eighth embodiment.
Figure 52:
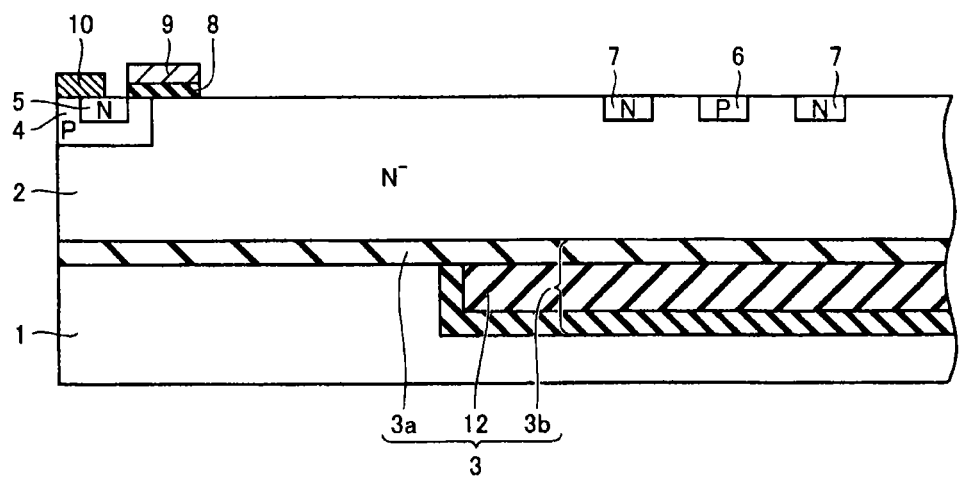
FIG. 52 is partial cross section along a line LII-LII shown in FIG. 51 in the eighth embodiment.
Figure 53:
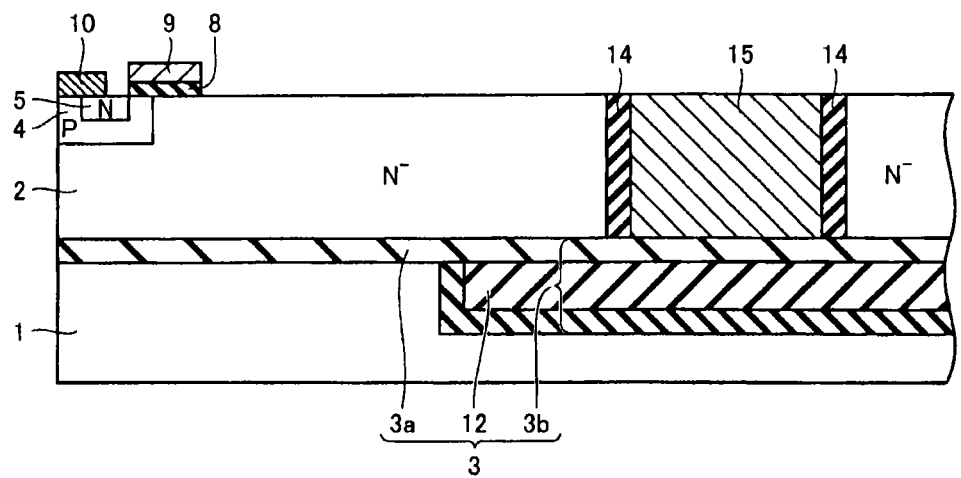
FIG. 53 is partial cross section along a line LIII-LIII shown in FIG. 51 in the eighth embodiment.

As a variation of the two-dimensional structure, the variation of the two-dimensional structure of the semiconductor device shown in FIG. 3 has exemplarily been described. Another variation thereof may be a variation of the two-dimensional structure of the semiconductor device shown in FIG. 10. In this case, as shown in FIG. 51, P-type impurity region 6 to which the collector electrode is connected, and insulating film 14 and conductive portion 15 that serve as a depletion layer block portion are alternately arranged along one direction. As shown in FIGS. 51 and 52, P-type impurity region 6 is formed from the surface of N⁻ semiconductor layer 2 to a predetermined depth. Further, as shown in FIGS. 51 and 53, insulating film 14 and conductive portion 15 are formed from the surface of N⁻ semiconductor layer 2 to reach dielectric portion 3.

Figure 54:
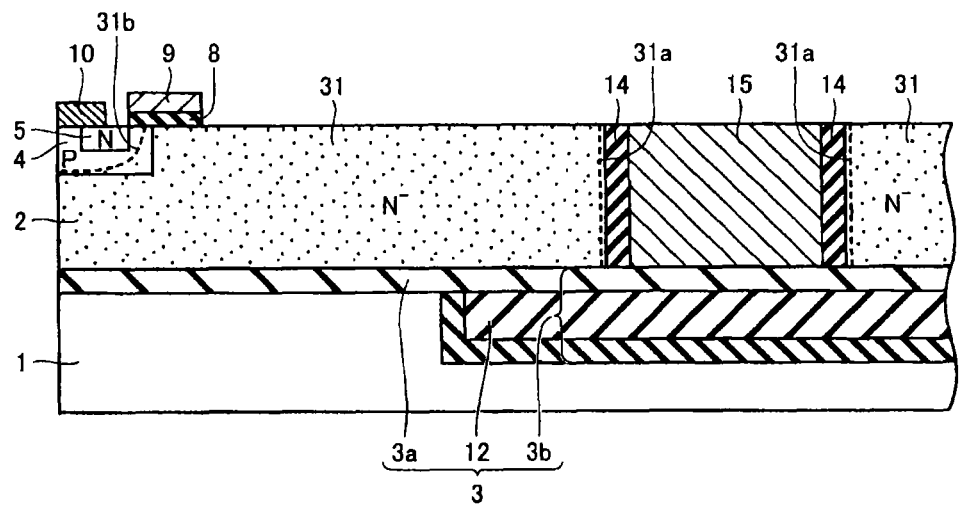
FIGS. 54 and 55 are first and second cross sections respectively for illustrating how a depletion layer expands while the semiconductor device of the first modification is in an OFF state in the eighth embodiment.
Figure 55:
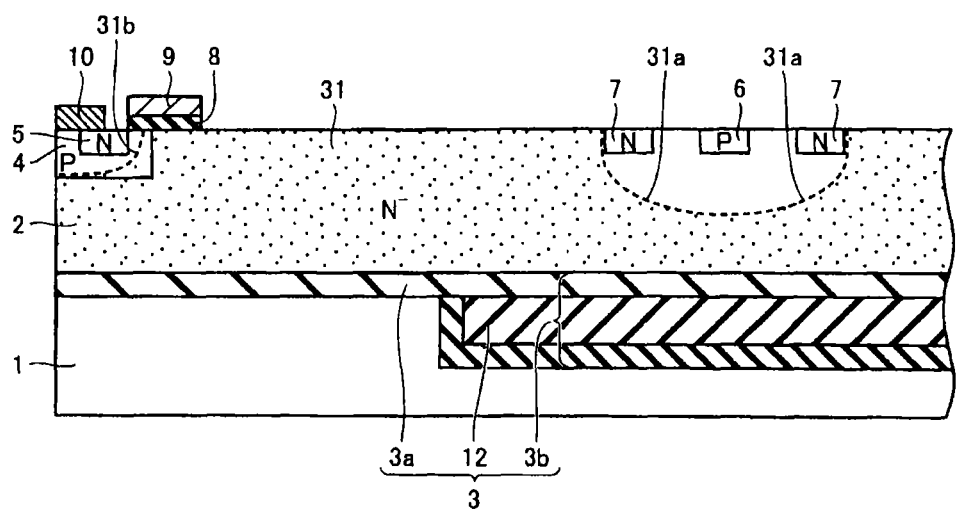

In this semiconductor device as well, as shown in FIG. 54, in a portion where insulating film 14 and conductive portion 15 are arranged, expansion of a depletion layer in an OFF state can be blocked (depletion-layer end 31a) by insulating film 14 and conductive portion 15 without lowering of the breakdown voltage. Accordingly, as shown in FIG. 55, in a portion where P-type impurity region 6 is disposed to be sandwiched between insulating films 14 and conductive portions 15, expansion of the depletion layer toward P-type impurity region 6 can be blocked (depletion-layer end 31a) without lowering of the breakdown voltage, in contrast to the case where such insulating films 14 and conductive portions 15 are not provided. Consequently, the breakdown voltage margin is enhanced and the breakdown voltage characteristic of the semiconductor device can surely be improved.

Second Modification

Figure 56:
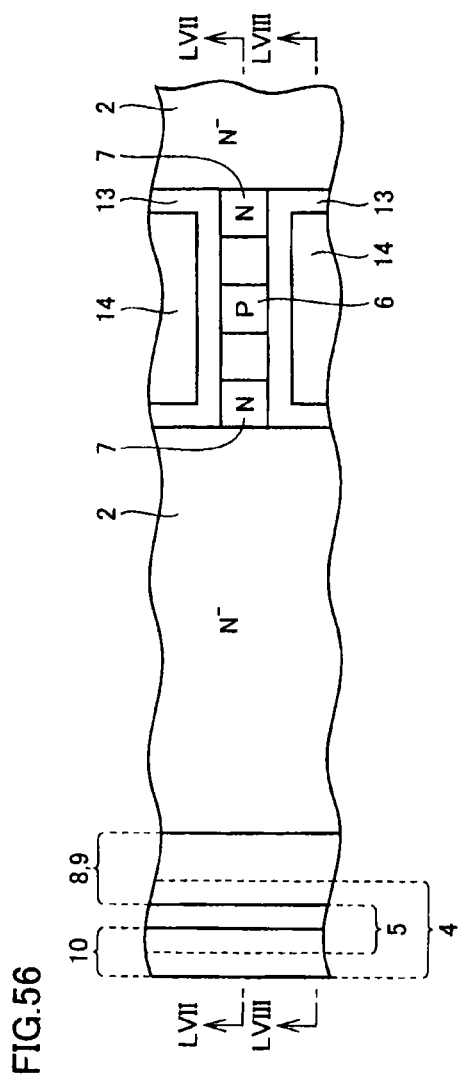
FIG. 56 is a partial enlarged plan view showing a semiconductor device according to a second modification in the eighth embodiment.
Figure 57:
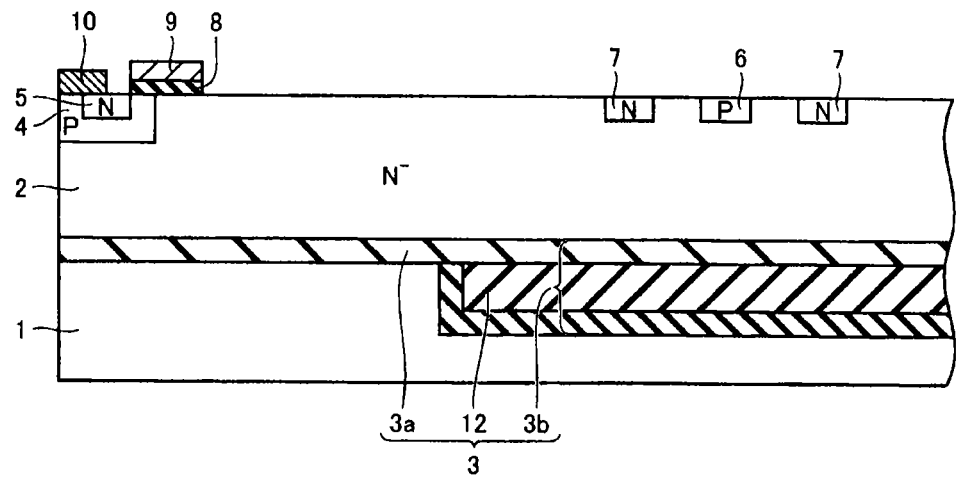
FIG. 57 is partial cross section along a line LVII-LVII shown in FIG. 56 in the eighth embodiment.
Figure 58:
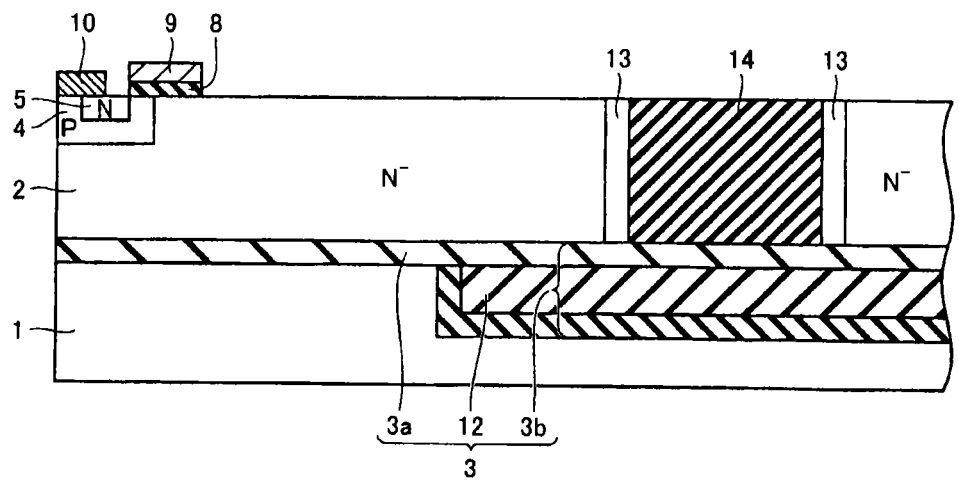
FIG. 58 is partial cross section along a line LVIII-LVIII shown in FIG. 56 in the eighth embodiment.

Still another variation of the two-dimensional structure may be a variation of the two-dimensional structure of the semiconductor device shown in FIG. 12. In this case, as shown in FIG. 56, P-type impurity region 6 to which the collector electrode is connected, and N-type impurity region 13 and insulating film 14 that serve as a depletion layer block portion are alternately arranged along one direction. As shown in FIGS. 56 and 57, P-type impurity region 6 is formed from the surface of N⁻ semiconductor layer 2 to a predetermined depth. Further, as shown in FIGS. 56 and 58, N-type impurity region 13 and insulating film 14 are formed from the surface of N⁻ semiconductor layer 2 to reach dielectric portion 3.

Figure 59:
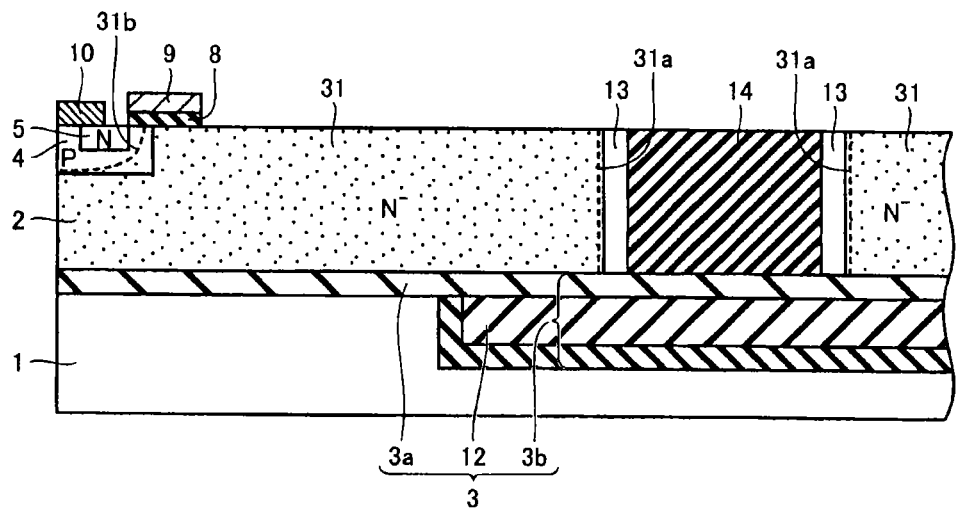
FIGS. 59 and 60 are first and second cross sections respectively for illustrating how a depletion layer expands while the semiconductor device of the second modification is in an OFF state in the eighth embodiment.
Figure 60:
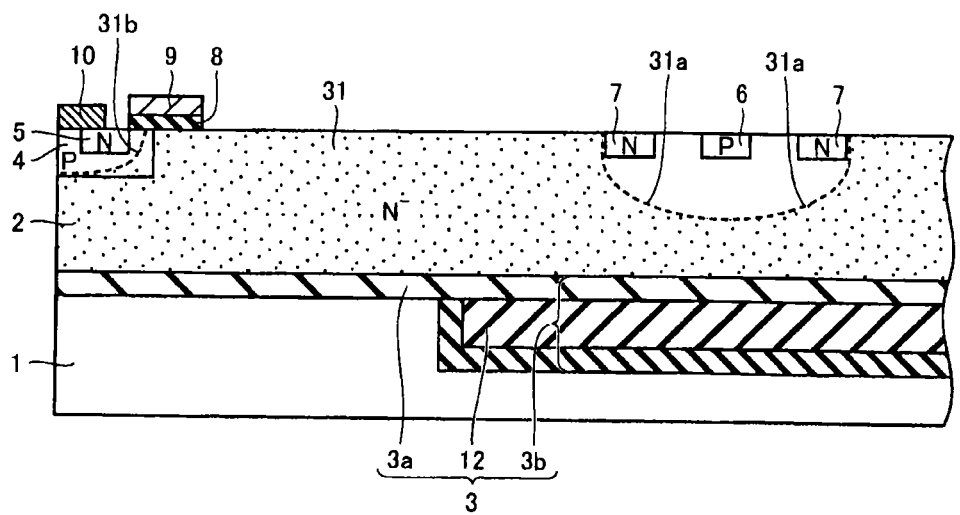

In this semiconductor device as well, as shown in FIG. 59, in a portion where N-type impurity region 13 and insulating film 14 are arranged, expansion of a depletion layer in an OFF state can be blocked (depletion-layer end 31a) by N-type impurity region 13 and insulating film 14 without lowering of the breakdown voltage. Accordingly, as shown in FIG. 60, in a portion where P-type impurity region 6 is disposed to be sandwiched between N-type impurity regions 13 and insulating films 14, expansion of the depletion layer toward P-type impurity region 6 can be blocked (depletion-layer end 31a) without lowering of the breakdown voltage, in contrast to the case where such N-type impurity regions 13 and insulating films 14 are not provided. Consequently, the breakdown voltage margin is enhanced and the breakdown voltage characteristic of the semiconductor device can surely be improved.

Ninth Embodiment

Figure 61:
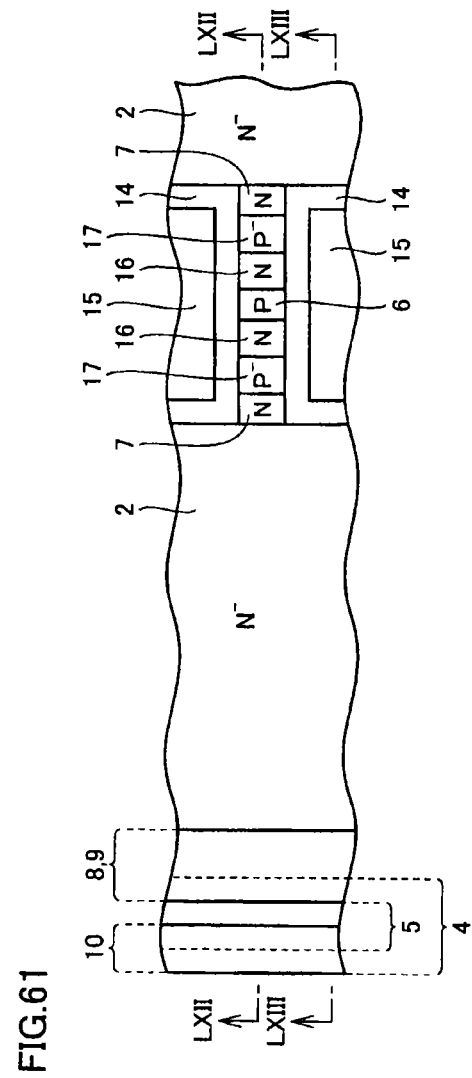
FIG. 61 is a partial enlarged plan view showing a semiconductor device according to a ninth embodiment.
Figure 62:
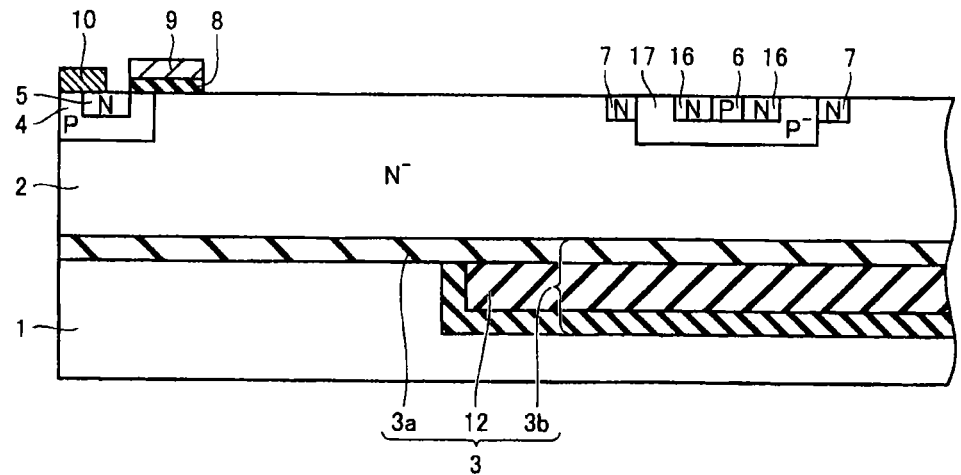
FIG. 62 is partial cross section along a line LXII-LXII shown in FIG. 61 in the ninth embodiment.
Figure 63:
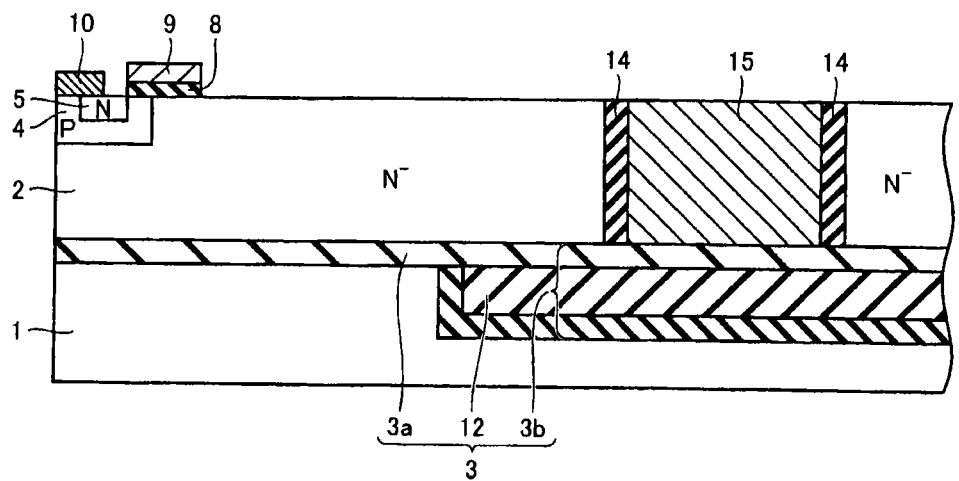
FIG. 63 is partial cross section along a line LXIII-LXIII shown in FIG. 61 in the ninth embodiment.

Here, a variation of the two-dimensional structure of the semiconductor device shown in FIG. 25 will be described. As shown in FIG. 61, a region including P-type impurity region 6 to which the collector electrode is connected, and insulating film 14 and conductive portion 15 that serve as a depletion layer block portion are alternately arranged along one direction. As shown in FIGS. 61 and 62, P-type impurity region 6 is formed from the surface of N⁻ semiconductor layer 2 to a predetermined depth. Further, as shown in FIGS. 61 and 63, insulating film 14 and conductive portion 15 are formed from the surface of N⁻ semiconductor layer 2 to reach dielectric portion 3. Except for the above, the structure of this semiconductor device is similar to the semiconductor device shown in FIG. 24, and therefore, the same components are denoted by the same reference characters and the description thereof will not be repeated.

In the above-described semiconductor device, a higher voltage than a predetermined threshold voltage applied to gate electrode 9 causes electrons and holes to be injected to N⁻ semiconductor layer 2, so that the resistance value of N⁻ semiconductor layer 2 decreases due to conductivity modulation to cause a state (ON state) in which electric current flows from the collector side toward the emitter side.

In contrast, a lower voltage than the threshold voltage applied to gate electrode 9 causes injection of electrons to N⁻ semiconductor layer 2 to stop, so that electrons and holes having been accumulated in N⁻ semiconductor layer 2 recombine to thereby disappear, or are discharged to emitter electrode 10 or collector electrode 11 to thereby disappear, to finally cause a state (OFF state) in which the electric current is interrupted. In the OFF state, a reverse bias is applied and, from the interface between P-type impurity region 4 and N⁻ semiconductor layer 2, a depletion layer expands mainly toward N⁻ semiconductor layer 2.

Figure 64:
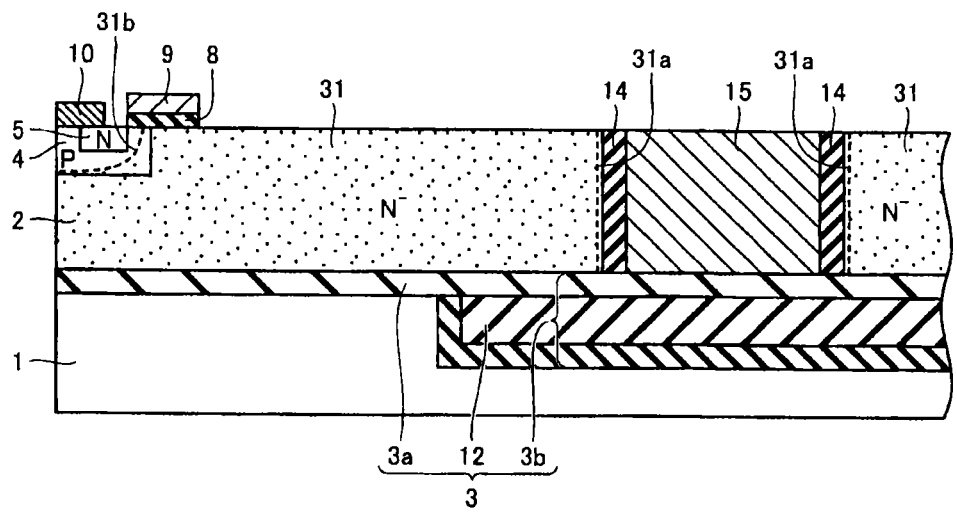
FIGS. 64 and 65 are first and second cross sections respectively for illustrating how a depletion layer expands while the semiconductor device is in an OFF state in the ninth embodiment.
Figure 65:
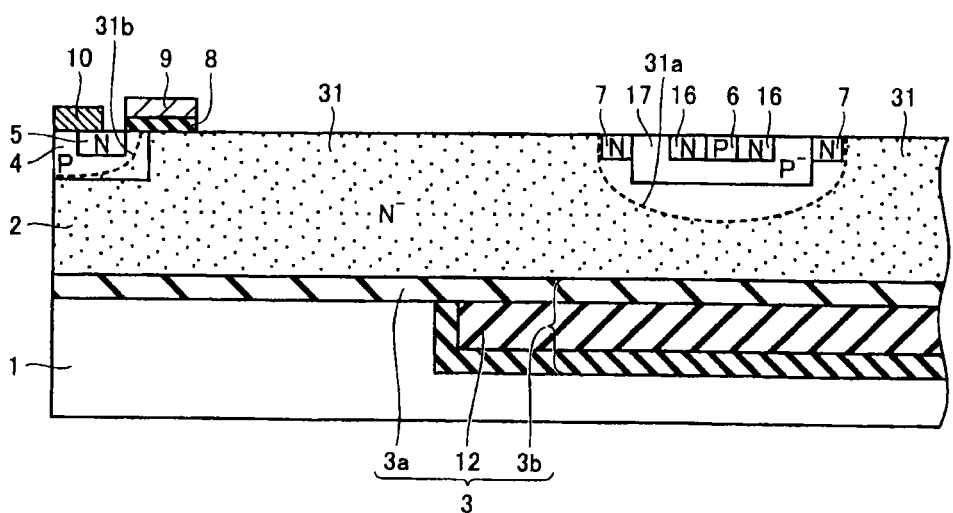

At this time, as shown in FIG. 64, in a portion where insulating film 14 and conductive portion 15 are arranged, expansion of a depletion layer can be blocked (depletion-layer end 31a) by insulating film 14 and conductive portion 15 without lowering of the breakdown voltage. Accordingly, as shown in FIG. 65, in a portion where P-type impurity region 6 is disposed to be sandwiched between insulating films 14 and conductive portions 15, expansion of the depletion layer toward P-type impurity region 6 can be blocked (depletion-layer end 31a) without lowering of the breakdown voltage, in contrast to the case where such insulating films 14 and conductive portions 15 are not provided. Consequently, the breakdown voltage margin is further enhanced and the breakdown voltage characteristic of the semiconductor device can surely be improved. Further, in a structure in which respective locations of N-type impurity region 16 and P-type impurity region 6 shown in FIGS. 61 and 62 are replaced with each other so that N-type impurity region 16 is sandwiched between P-type impurity regions 6, the breakdown voltage characteristic of the semiconductor device can be improved as well.

Regarding the semiconductor device above, the exemplary structure in which insulating film 14 and conductive portion 15 are formed in a trench to serve as a depletion layer block portion has been described. Alternatively, as the depletion layer block portion, the structure in which N-type impurity region 13 is formed as shown in FIG. 3 may also be employed. In this case as well, expansion of a depletion layer can surely be blocked without lowering of the breakdown voltage to improve the breakdown voltage characteristic of the semiconductor device. Further, as shown in FIG. 12, the structure in which N-type impurity region 13 is formed along the sidewall of a trench and the trench is filled with insulating film 14 formed therein may also be employed. In this case as well, expansion of a depletion layer can surely be blocked without lowering of the breakdown voltage to improve the breakdown voltage characteristic of the semiconductor device.

Tenth Embodiment

Figure 66:
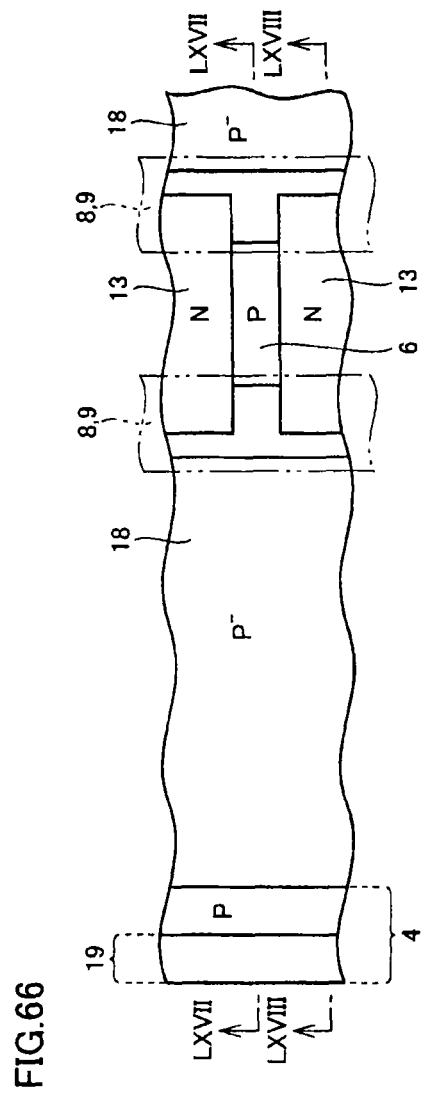
FIG. 66 is a partial enlarged plan view showing a semiconductor device according to a tenth embodiment of the present invention.
Figure 67:
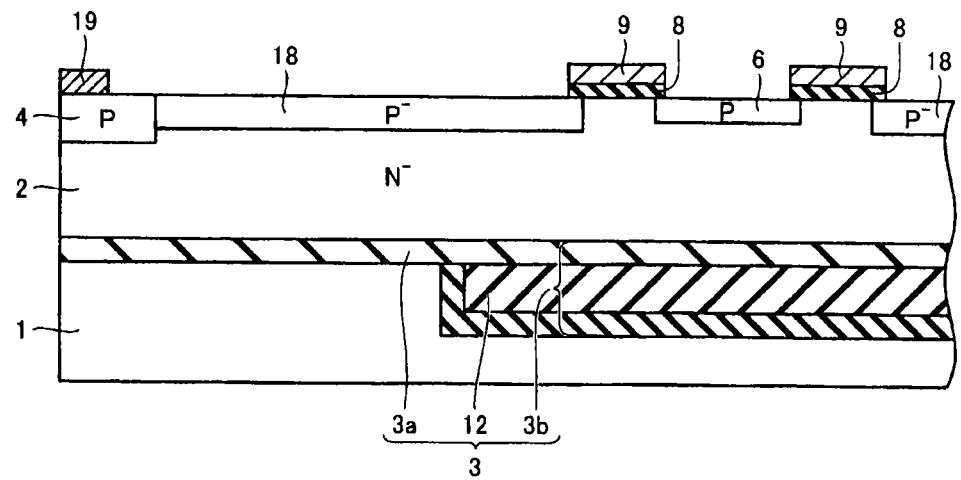
FIG. 67 is partial cross section along a line LXVII-LXVII shown in FIG. 66 in the tenth embodiment.
Figure 68:
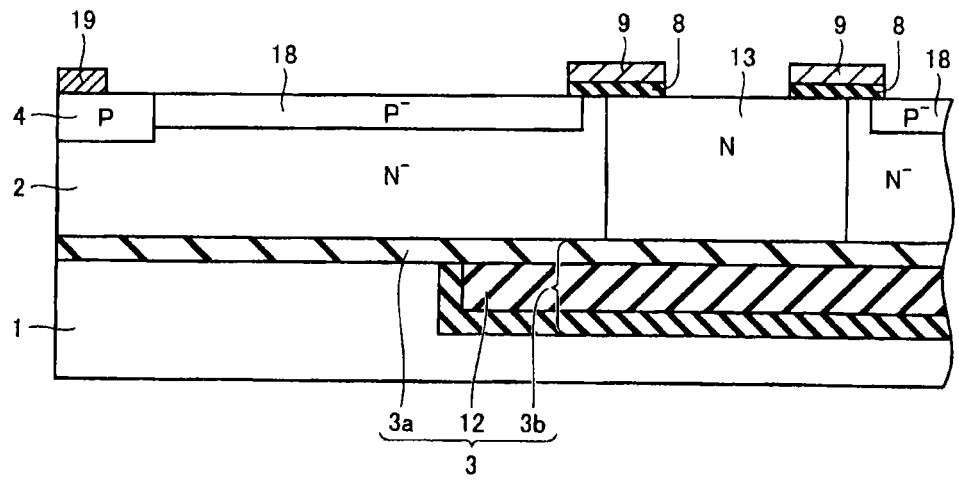
FIG. 68 is partial cross section along a line LXVIII-LXVIII shown in FIG. 66 in the tenth embodiment.

Here, a variation of the two-dimensional structure of the semiconductor device shown in FIG. 38 will be described. As shown in FIG. 66, P-type impurity region 6 to which the source electrode is connected and N-type impurity region 13 serving as a depletion layer block portion are alternately arranged along one direction. As shown in FIGS. 66 and 67, P-type impurity region 6 is formed from the surface of N⁻ semiconductor layer 2 to a predetermined depth. Further, as shown in FIGS. 66 and 68, N-type impurity region 13 is formed from the surface of N⁻ semiconductor layer 2 to reach dielectric portion 3. Except for the above, the structure of this semiconductor device is similar to the semiconductor device shown in FIG. 38, and therefore, the same components are denoted by the same reference characters and the description thereof will not be repeated.

In the above-described semiconductor device, a voltage lower by a predetermined potential than a source potential applied to gate electrode 9 causes a channel to be formed in a portion of N⁻ semiconductor layer 2 that is located directly below gate electrode 9. With the channel thus formed, a state is caused in which electric current flows from source electrode 20 to drain electrode 19 (ON state).

In contrast, an increased potential applied to gate electrode 9 causes the channel formed in N⁻ semiconductor layer 2 to disappear, resulting in an OFF state. In the OFF state, a reverse bias is applied and, from the interface between P-type impurity region 4, P⁻ impurity region 18, and N⁻ semiconductor layer 2, depletion layer 31 expands.

Figure 69:
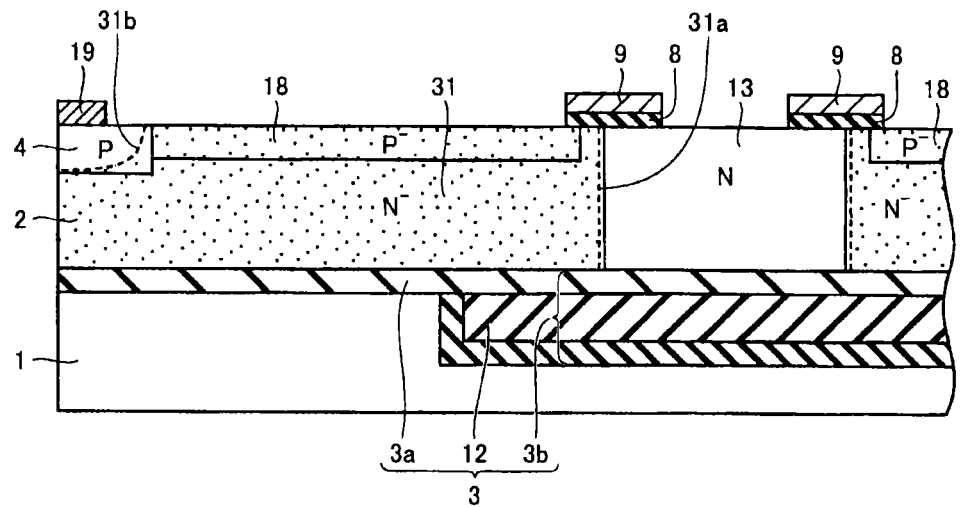
FIGS. 69 and 70 are first and second cross sections respectively for illustrating how a depletion layer expands while the semiconductor device is in an OFF state in the tenth embodiment.
Figure 70:
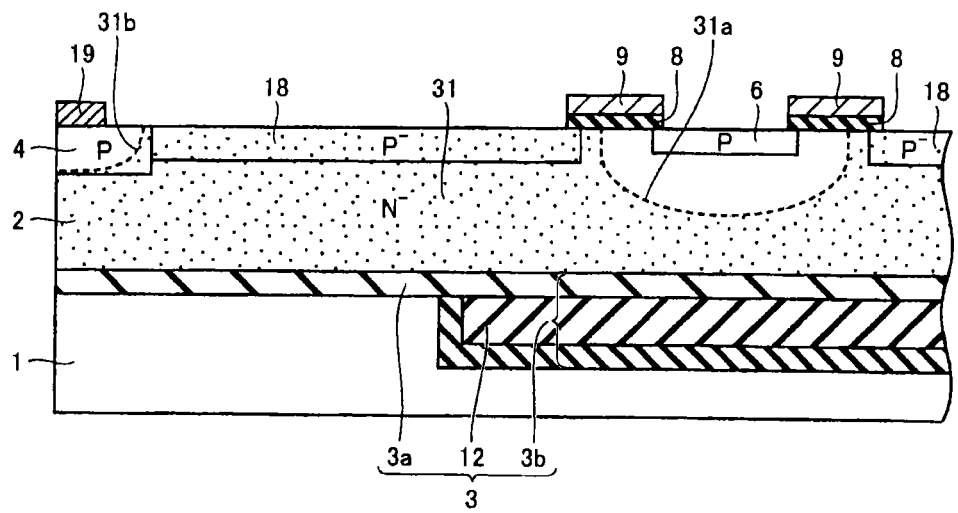

At this time, as shown in FIG. 69, in a portion where N-type impurity region 13 is disposed, expansion of the depletion layer can be blocked (depletion-layer end 31a) by N-type impurity region 13 without lowering of the breakdown voltage. Accordingly, as shown in FIG. 70, in the portion where P-type impurity region 6 is disposed to be sandwiched between N-type impurity regions 13, expansion of the depletion layer toward P-type impurity region 6 is blocked (depletion-layer end 31a) without lowering of the breakdown voltage, in contrast to the case where such N-type impurity regions 13 are not disposed. Consequently, the breakdown voltage margin is further enhanced and the breakdown voltage characteristic of the semiconductor device can surely be improved.

First Modification

Figure 71:
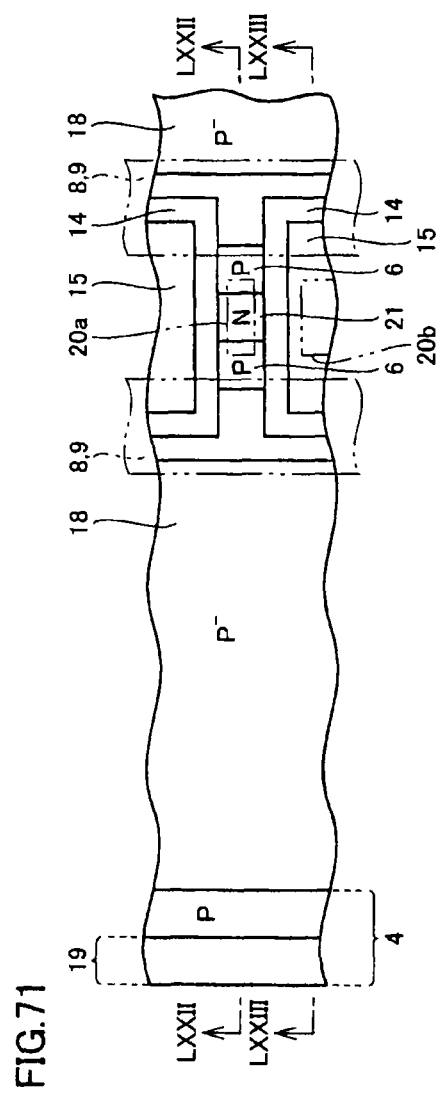
FIG. 71 is a partial enlarged plan view showing a semiconductor device according to a first modification in the tenth embodiment.
Figure 72:
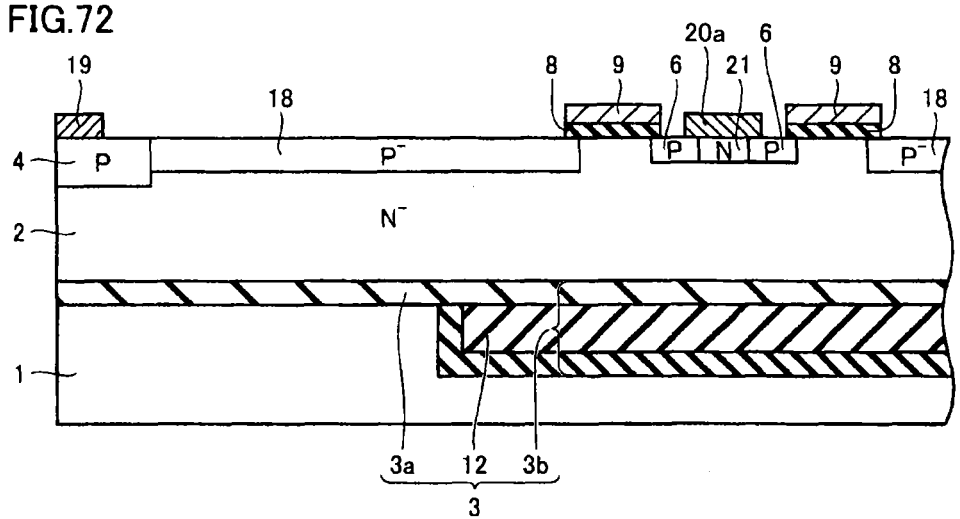
FIG. 72 is partial cross section along a line LXXII-LXXII shown in FIG. 71 in the tenth embodiment.
Figure 73:
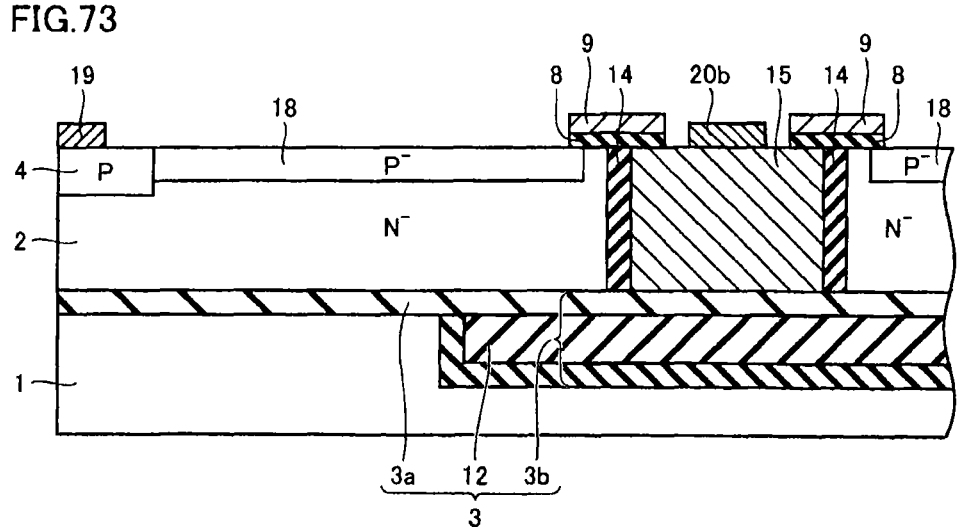
FIG. 73 is partial cross section along a line LXXIII-LXXIII shown in FIG. 71 in the tenth embodiment.

As a variation of the two-dimensional structure, the variation of the two-dimensional structure of the semiconductor device shown in FIG. 38 has exemplarily been described. Another variation thereof may be a variation of the two-dimensional structure of the semiconductor device shown in FIG. 41. In this case, as shown in FIG. 71, P-type impurity region 6 to which a source electrode 20a is connected, and insulating film 14 and conductive portion 15 that serve as a depletion layer block portion are alternately arranged along one direction. As shown in FIGS. 71 and 72, P-type impurity region 6 is formed from the surface of N⁻ semiconductor layer 2 to a predetermined depth. Further, as shown in FIGS. 71 and 73, insulating film 14 and conductive portion 15 are formed from the surface of N⁻ semiconductor layer 2 to reach dielectric portion 3. P-type impurity region 6 and conductive portion 15 are electrically connected through source electrode 20a and an electrode 20b.

Figure 74:
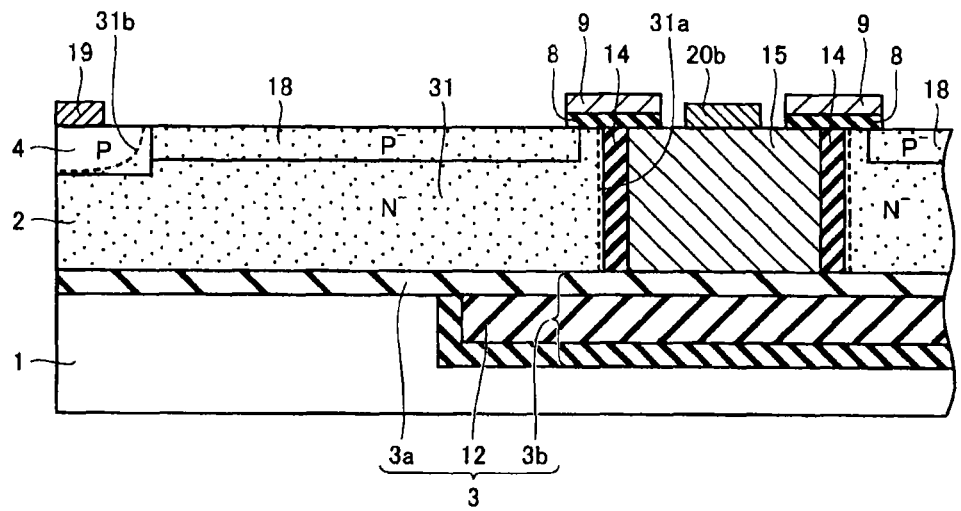
FIGS. 74 and 75 are first and second cross sections respectively for illustrating how a depletion layer expands while the semiconductor device of the first modification is in an OFF state in the tenth embodiment.
Figure 75:
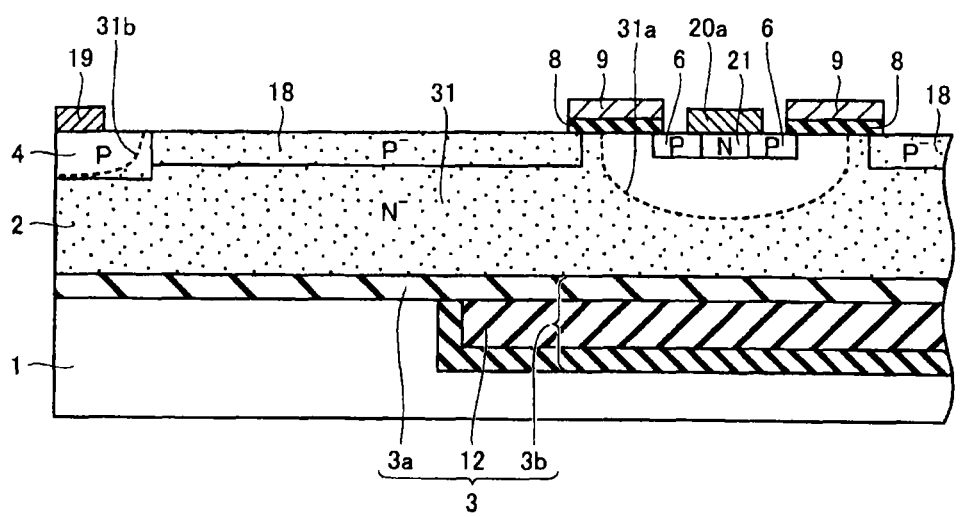

In this semiconductor device as well, as shown in FIG. 74, in a portion where insulating film 14 and conductive portion 15 are arranged, expansion of a depletion layer in an OFF state can be blocked (depletion-layer end 31a) by insulating film 14 and conductive portion 15 without lowering of the breakdown voltage. Accordingly, as shown in FIG. 75, in a portion where P-type impurity region 6 is disposed to be sandwiched between insulating films 14 and conductive portions 15, expansion of a depletion layer toward P-type impurity region 6 is blocked (depletion-layer end 31a) without lowering of the breakdown voltage, in contrast to the case where such insulating films 14 and conductive portions are not provided. Consequently, the breakdown voltage margin is further enhanced and the breakdown voltage characteristic of the semiconductor device can surely be improved.

Second Modification

Figure 76:
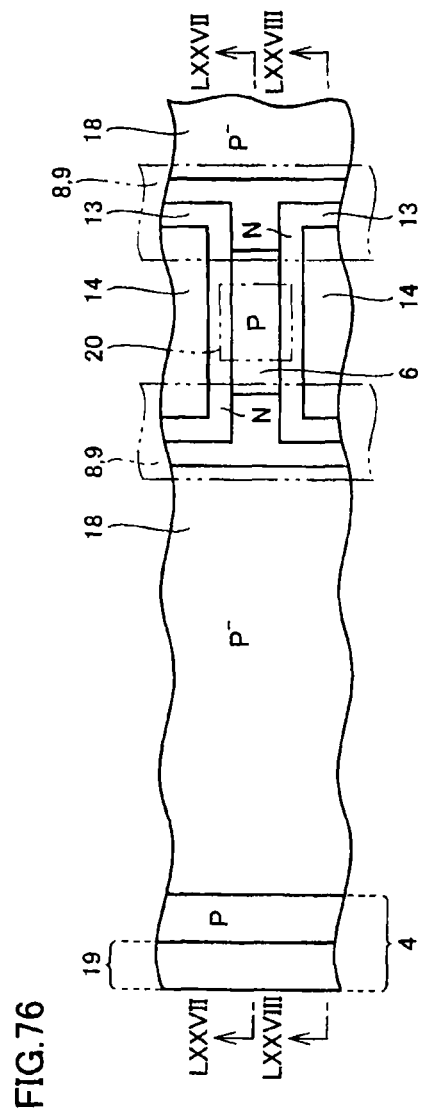
FIG. 76 is a partial enlarged plan view showing a semiconductor device according to a second modification in the tenth embodiment.
Figure 77:
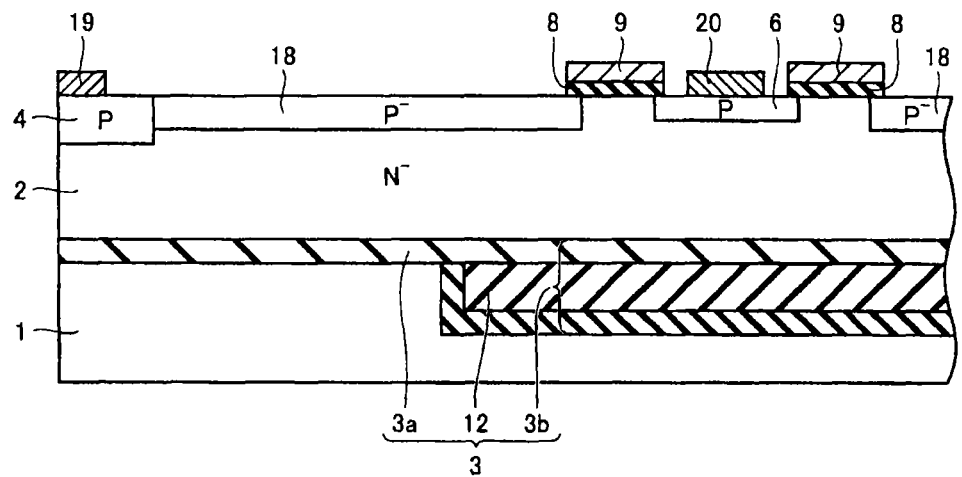
FIG. 77 is partial cross section along a line LXXVII-LXXVII shown in FIG. 76 in the tenth embodiment.
Figure 78:
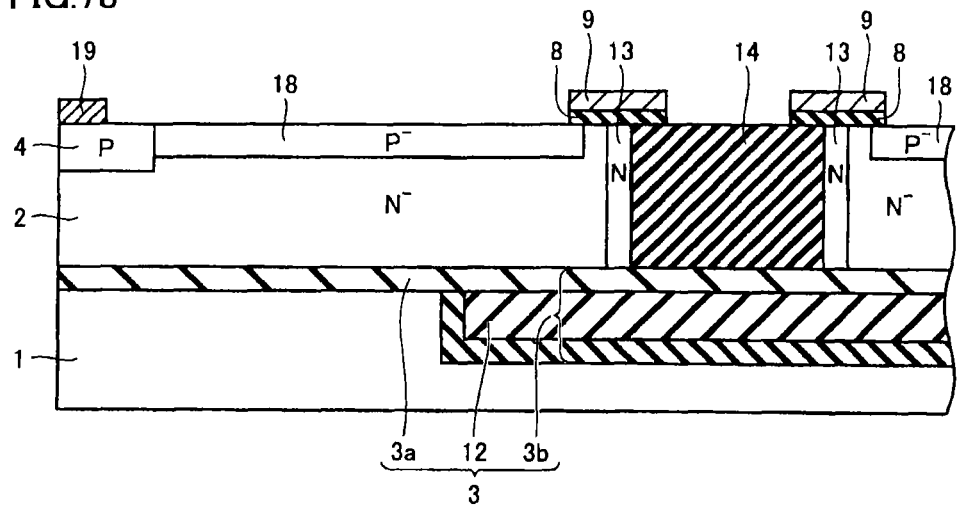
FIG. 78 is partial cross section along a line LXXVIII-LXXVIII shown in FIG. 76 in the tenth embodiment.

Another variation of the two-dimensional structure may be a variation of the two-dimensional structure of the semiconductor device shown in FIG. 43. In this case, as shown in FIG. 76, P-type impurity region 6 to which source electrode 20 is connected, and N-type impurity region 13 and insulating film 14 that serve as a depletion layer block portion are alternately arranged along one direction. As shown in FIGS. 76 and 77, P-type impurity region 6 is formed from the surface of N⁻ semiconductor layer 2 to a predetermined depth. Further, as shown in FIGS. 76 and 78, N-type impurity region 13 and insulating film 14 are formed from the surface of N⁻ semiconductor layer 2 to reach dielectric portion 3. N-type impurity region 13 and P-type impurity region 6 are electrically connected by source electrode 20.

Figure 79:
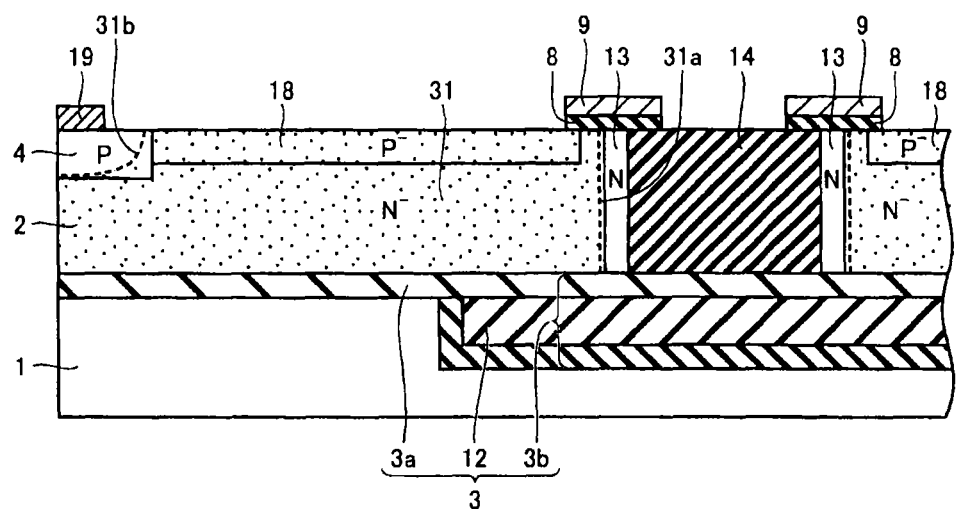
FIGS. 79 and 80 are first and second cross sections respectively for illustrating how a depletion layer expands while the semiconductor device of the second modification is in an OFF state in the tenth embodiment.
Figure 80:
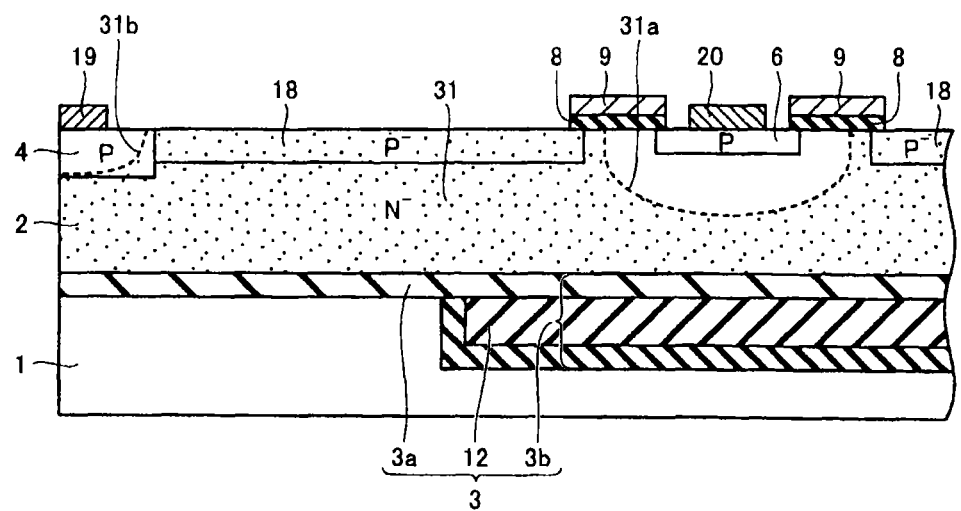

In this semiconductor device as well, as shown in FIG. 79, in a portion where N-type impurity region 13 and insulating film 14 are arranged, expansion of a depletion layer in an OFF state can be blocked (depletion-layer end 31a) by N-type impurity region 13 and insulating film 14 without lowering of the breakdown voltage. Accordingly, as shown in FIG. 80, in a portion where P-type impurity region 6 is disposed to be sandwiched between N-type impurity regions 13 and insulating films 14, expansion of the depletion layer toward P-type impurity region 6 is blocked (depletion-layer end 31a) without lowering of the breakdown voltage, in contrast to the case where such N-type impurity regions 13 and insulating films 14 are not disposed. Consequently, the breakdown voltage margin is further enhanced and the breakdown voltage characteristic of the semiconductor device can surely be improved.

While the above-described semiconductor devices are each applied exemplarily to an inverter circuit, the above-described semiconductor devices are applicable not only to the inverter circuit but to a power semiconductor element for which a high breakdown voltage is required.

The present invention is effectively used as a semiconductor device applied to an inverter circuit or the like.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device comprising:
   a semiconductor substrate having a main surface;
   a dielectric portion formed to contact the main surface of said semiconductor substrate and having a first thickness and a second thickness larger than said first thickness;
   a semiconductor region of a first conductivity type formed to contact said dielectric portion and having a first impurity concentration;
   a first impurity region of a second conductivity type having a second impurity concentration and formed from a surface of said semiconductor region to a first depth in a first region of said semiconductor region, said first region being located directly above a portion which is a part of said dielectric portion and has said first thickness;
   a second impurity region of the second conductivity type having a third impurity concentration lower than said second impurity concentration, formed from the surface of said semiconductor region to a predetermined depth, and extending from said first impurity region toward a second region of said semiconductor region, said second region being located directly above a portion which is a part of said dielectric portion and has said second thickness;
   a third impurity region of the second conductivity type located at a distance from said second impurity region and formed in said second region from the surface of said semiconductor region to a predetermined depth;
   a gate electrode portion formed on a surface of a portion of said semiconductor region located between said second impurity region and said third impurity region with a gate insulating film interposed between said gate electrode portion and the surface of the portion of said semiconductor region; and
   a depletion layer block portion including a conductive region and formed at a predetermined position in said second region to extend from the surface of said semiconductor region and reach said dielectric portion.

2. The semiconductor device according to claim 1, wherein said depletion layer block portion is formed to be arranged in one of a first arrangement in which said depletion layer block portion is arranged on an opposite side to a side where said second impurity region is located, with respect to said third impurity region, and a second arrangement in which said depletion layer block portion is arranged to sandwich said third impurity region from one side and an opposite side in a direction crossing a direction along which said second impurity region and said third impurity region are disposed.

3. The semiconductor device according to claim 2, wherein said depletion layer block portion is formed of a fourth impurity region of the first conductivity type having a fourth impurity concentration higher than said first impurity concentration.

4. The semiconductor device according to claim 2, wherein said depletion layer block portion is formed of a conductive portion electrically insulated from said semiconductor region and electrically connected to said third impurity region.

5. The semiconductor device according to claim 2, wherein said depletion layer block portion is formed of:
   an insulating portion formed through said semiconductor region to extend from the surface of said semiconductor region and reach said dielectric portion; and
   a fourth impurity region of the first conductivity type formed in a portion of said semiconductor region surrounding said insulating portion, said fourth impurity region having a fourth impurity concentration higher than said first impurity concentration.

* * * * *